US012666622B2

(12) United States Patent
Lee et al.

(10) Patent No.: US 12,666,622 B2
(45) Date of Patent: Jun. 23, 2026

(54) NON-VOLATILE MEMORY DEVICE AND SYSTEM INCLUDING THE SAME

(71) Applicant: SAMSUNG ELECTRONICS CO., LTD., Suwon-si (KR)

(72) Inventors: Min Jun Lee, Suwon-si (KR); Jong Ho Woo, Suwon-si (KR); Yong Seok Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 366 days.

(21) Appl. No.: 18/217,730

(22) Filed: Jul. 3, 2023

(65) Prior Publication Data

US 2024/0015977 A1 Jan. 11, 2024

(30) Foreign Application Priority Data

Jul. 5, 2022 (KR) ......................... 10-2022-0082439

(51) Int. Cl.
| | |
|---|---|
| *H10B 51/20* | (2023.01) |
| *G11C 5/06* | (2006.01) |
| *G11C 11/22* | (2006.01) |
| *H10B 51/10* | (2023.01) |
| *H10B 51/30* | (2023.01) |
| *H10D 30/01* | (2025.01) |
| *H10D 30/69* | (2025.01) |

(52) U.S. Cl.
CPC .............. *H10B 51/20* (2023.02); *G11C 5/063* (2013.01); *G11C 11/223* (2013.01); *H10B 51/10* (2023.02);
(Continued)

(58) Field of Classification Search
CPC ........ H10B 51/10; H10B 51/20; H10B 51/30; H10D 30/0415; H10D 30/701;
(Continued)

(56) References Cited

U.S. PATENT DOCUMENTS

| | | | |
|---|---|---|---|
| 10,937,809 B1 | 3/2021 | Sharangpani et al. | |
| 11,170,836 B1 | 11/2021 | Tang | |

(Continued)

FOREIGN PATENT DOCUMENTS

| | | | | |
|---|---|---|---|---|
| CN | 111081299 A | 4/2020 | | |
| CN | 113410254 A | * 9/2021 | ......... | H10D 30/0415 |

(Continued)

OTHER PUBLICATIONS

First OA dated Feb. 22, 2024 for corresponding application No. TW 112119221.

Primary Examiner — Matthew E Warren
(74) Attorney, Agent, or Firm — Muir Patent Law, PLLC

(57) ABSTRACT

A non-volatile memory device includes a substrate; an insulating layer on the substrate; a bit line isolation layer on the insulating layer; a common source line conductive layer on the bit line isolation layer; a ferroelectric memory cell on the bit line isolation layer; a bit line connected to a top of the ferroelectric memory cell; and a common source line connected to the common source line conductive layer and electrically connected to the ferroelectric memory cell, wherein the ferroelectric memory cell includes a ferroelectric layer, a channel layer, a first conductive filler connected to the ferroelectric layer and the channel layer and extending in a vertical direction, and a second conductive filler connected to the ferroelectric layer and the channel layer and extending in the vertical direction, the first conductive filler is connected to the bit line, and the second conductive filler is connected to the common source line.

20 Claims, 37 Drawing Sheets

(52) U.S. Cl.
CPC ........... *H10B 51/30* (2023.02); *H10D 30/701*
(2025.01); *G11C 11/2273* (2013.01); *G11C
11/2275* (2013.01); *H10D 30/0415* (2025.01)

(58) Field of Classification Search
CPC ... G11C 5/062; G11C 11/223; G11C 11/2255;
G11C 11/2273; G11C 11/2275
See application file for complete search history.

(56) References Cited

U.S. PATENT DOCUMENTS

| | | | | |
|---|---|---|---|---|
| 12,315,814 | B2 * | 5/2025 | Yu .......................... | H10B 43/50 |
| 2017/0373084 | A1 * | 12/2017 | Shim ...................... | H10B 43/27 |
| 2021/0126013 | A1 | 4/2021 | Lai et al. | |
| 2021/0175252 | A1 | 6/2021 | Han et al. | |
| 2021/0375929 | A1 | 12/2021 | Lu et al. | |
| 2021/0384221 | A1 | 12/2021 | Song et al. | |
| 2022/0005830 | A1 | 1/2022 | Wu et al. | |
| 2022/0285394 | A1 * | 9/2022 | Ling ...................... | H10B 51/20 |
| 2022/0336488 | A1 * | 10/2022 | Lee ........................ | H10B 43/40 |
| 2023/0217660 | A1 * | 7/2023 | Lee ........................ | H10B 43/50 |
| | | | | 257/314 |

FOREIGN PATENT DOCUMENTS

| | | | | | |
|---|---|---|---|---|---|
| KR | 20230149112 | A | * 10/2023 | ........... | H10D 64/689 |
| TW | 202145513 | A | 12/2021 | | |
| WO | WO-2022239956 | A1 | * 11/2022 | ............. | G11C 16/30 |

* cited by examiner

PGM operation("1" write)

WL > 0

CSL
(GND)

BL
(GND)

PGM operation("0" write)

WL < 0

CSL
(GND)

BL
(GND)

Read operation

WL = 0

C'

B ← - - - - - - - - - - - - - - - - - - - - - - - - - - - - - → B'

102(102p) →

104 →

C

NON-VOLATILE MEMORY DEVICE AND SYSTEM INCLUDING THE SAME

CROSS-REFERENCE TO RELATED APPLICATION

This application claims priority from Korean Patent Application No. 10-2022-0082439 filed on Jul. 5, 2022, in the Korean Intellectual Property Office, and all the benefits accruing therefrom under 35 U.S.C. 119, the contents of which in its entirety are herein incorporated by reference.

BACKGROUND

1. Field

Embodiments relate to a non-volatile memory device and a system including the same.

2. Description of the Related Art

Degree of integration of semiconductor devices gradually increases to satisfy superior performance and low cost for consumers. In the case of planar or two-dimensional semiconductor devices, the degree of integration may be determined mainly by an area occupied by unit cells, and may be greatly affected by a level of fine patterning technology.

In recent years, as the design rules of the semiconductor elements have rapidly decreased, there is a limit to the formation of fine patterns due to a resolution limit of a process for forming patterns for implementing the semiconductor devices. Accordingly, three-dimensional semiconductor devices in which cells are arranged three-dimensionally have been considered.

SUMMARY

The embodiments may be realized by providing a non-volatile memory device including a substrate; an insulating layer on the substrate; a bit line isolation layer on the insulating layer; a common source line conductive layer on the bit line isolation layer; a ferroelectric memory cell on the bit line isolation layer; a bit line connected to a top of the ferroelectric memory cell; and a common source line connected to the common source line conductive layer and electrically connected to the ferroelectric memory cell, wherein the ferroelectric memory cell includes a ferroelectric layer, a channel layer, a first conductive filler connected to the ferroelectric layer and the channel layer and extending in a vertical direction, and a second conductive filler connected to the ferroelectric layer and the channel layer and extending in the vertical direction, the first conductive filler is connected to the bit line, and the second conductive filler is connected to the common source line.

The embodiments may be realized by providing a non-volatile memory device including a substrate; an insulating layer on the substrate; a bit line isolation layer on the insulating layer; a common source line conductive layer on the bit line isolation layer; and a ferroelectric memory cell on the bit line isolation layer, wherein the ferroelectric memory cell includes a ferroelectric layer, a channel layer, a first conductive filler connected to the ferroelectric layer and the channel layer and extending in a vertical direction, and a second conductive filler connected to the ferroelectric layer and the channel layer and extending in the vertical direction, the first conductive filler is connected to the bit line isolation layer, and the second conductive filler is connected to the common source line conductive layer.

The embodiments may be realized by providing a non-volatile memory system including a main processor; a storage device that transmits and receives data for operation of the main processor; and a non-volatile memory device that stores data, wherein the non-volatile memory device includes a substrate; an insulating layer on the substrate; a bit line isolation layer on the insulating layer; a common source line conductive layer on the bit line isolation layer; a ferroelectric memory cell on the bit line isolation layer; a bit line connected to a top of the ferroelectric memory cell; and a common source line connected to the common source line conductive layer and electrically connected to the ferroelectric memory cell, wherein the ferroelectric memory cell includes a ferroelectric layer, a channel layer, a first conductive filler connected to the ferroelectric layer and the channel layer and extending in a vertical direction, and a second conductive filler connected to the ferroelectric layer and the channel layer and extending in the vertical direction, wherein the first conductive filler is connected to the bit line, and wherein the second conductive filler is connected to the common source line.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
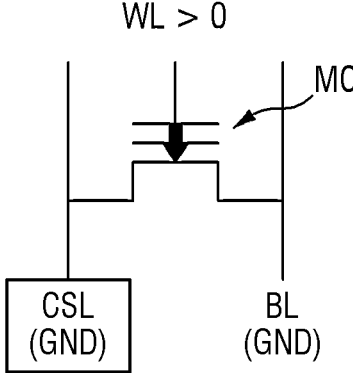
FIGS. 1 to 3 are exemplary circuit diagrams showing an operation of memory cells of a non-volatile memory device according to some embodiments.
Figure 2:
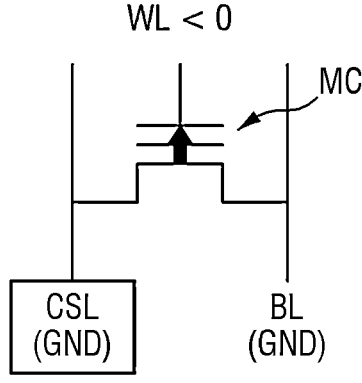
Figure 3:
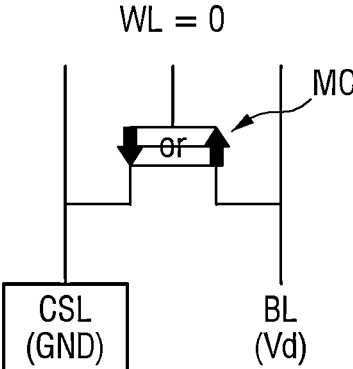

FIGS. 1 to 3 are exemplary circuit diagrams showing an operation of memory cells of a non-volatile memory device according to some embodiments.

Referring to FIGS. 1 to 3, the non-volatile memory device according to some embodiments may be a three-dimensional non-volatile memory device, and may be made up of or include a ferroelectric field effect transistor (FeFET).

The non-volatile memory device may include a memory cell MC including ferroelectrics, and a bit line BL, a word line WL, and a common source line CSL electrically connected to the memory cell MC. The ferroelectrics may include, e.g., barium titanate ($BaTiO_3$), lead zirconate titanate (PZT; $PbZrTiO_3$), strontium bismuth tantalate (STB; $SrBi_2Ta_2O_9$), bismuth iron oxide (BFO; $BiFeO_3$), or hafnium oxide ($HfO_2$). As used herein, the term "or" is not an exclusive term, e.g., "A or B" would include A, B, or A and B.

In an implementation, as illustrated in FIGS. 1 to 3, one memory cell, and one common source line, one word line and one bit line connected to the memory cell may be included, or, in the non-volatile memory device according to some embodiments, a plurality of memory cells, a plurality of bit lines, a plurality of word lines, and a plurality of common source lines may be connected in a three-dimensional structure.

An operation (PGM operation ("1" write)) in which the non-volatile memory device stores data "1" will be described referring to FIG. 1.

A voltage greater than 0 may be applied to the word line WL. At this time, the common source line CSL and the bit line BL are grounded (GND), and "1" may be written to the memory cell MC.

An operation (PGM operation ("0" write)) in which the non-volatile memory device stores data "0" will be described referring to FIG. 2.

A voltage smaller than 0 may be applied to the word line WL. At this time, the common source line CSL and the bit line BL are grounded (GND), and "0" may be written to the memory cell MC.

An operation (Read operation) of reading data stored in the memory cell MC by the non-volatile memory device will be described referring to FIG. 3.

A voltage of 0 may be applied to the word line WL. At this time, the common source line CSL is grounded (GND), and a voltage Vd for reading data stored in the memory cell MC may be applied to the bit line BL.

The non-volatile memory device according to some embodiments may apply ground GND to the common source line CSL to drive the ferroelectric field effect transistor. In an implementation, a plurality of common source lines CSL connected to the plurality of memory cells MC of the non-volatile memory device may be combined into one, and a ground GND voltage may be applied to the plurality of memory cells MC with only one common source line CSL in the BEOL (Back End Of Line) process.

In an implementation, the process efficiency may be enhanced by reducing the complexity when forming the common source line in the BEOL process of the non-volatile memory devices according to some embodiments.

The contents described above will be described in detail, in connection with the structure of the non-volatile memory device according to some embodiments and intermediate step diagrams of fabricating the same.

Figure 4:
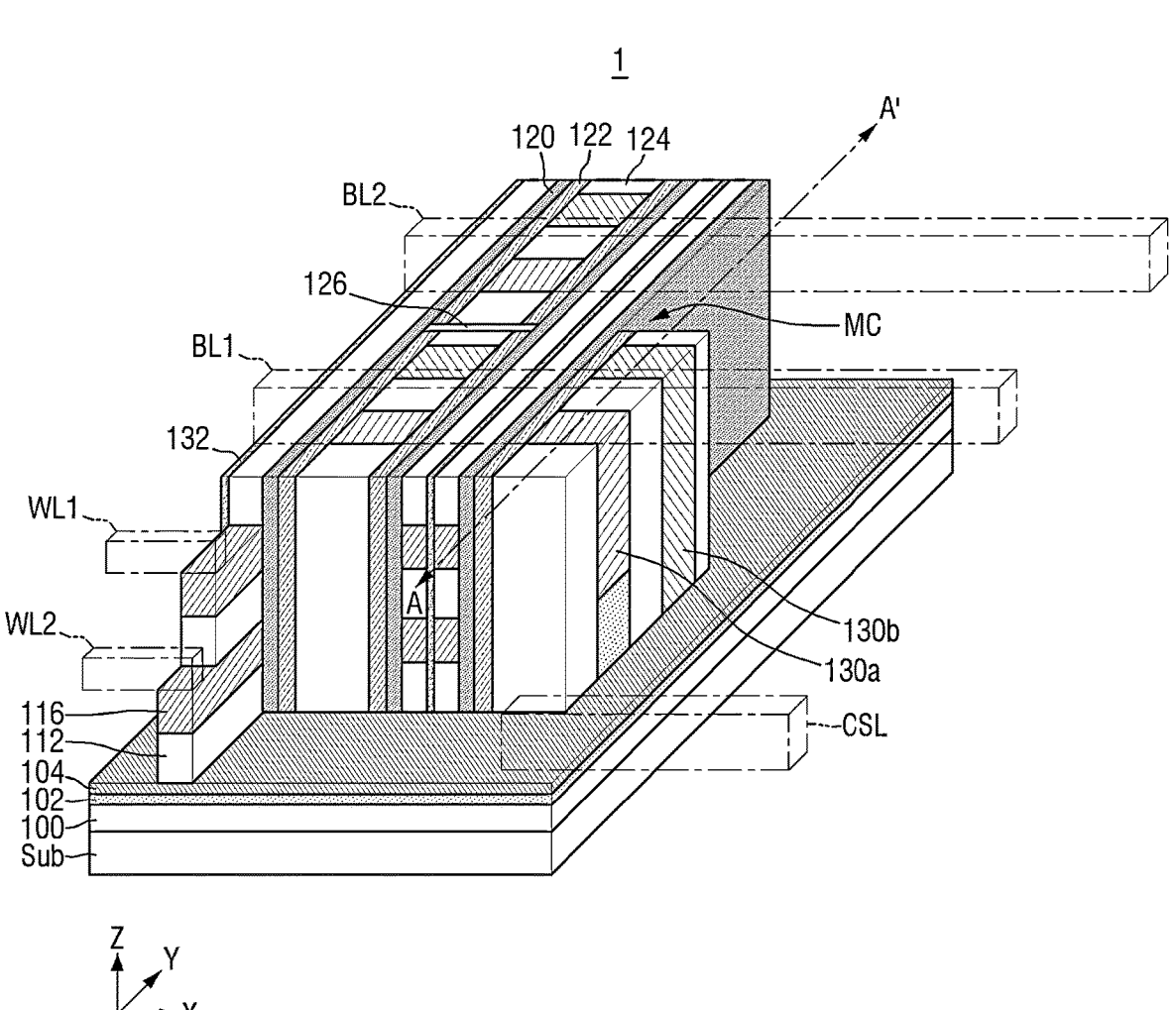
FIGS. 4 and 5 are exemplary perspective views showing a non-volatile memory device according to some embodiments.
Figure 5:
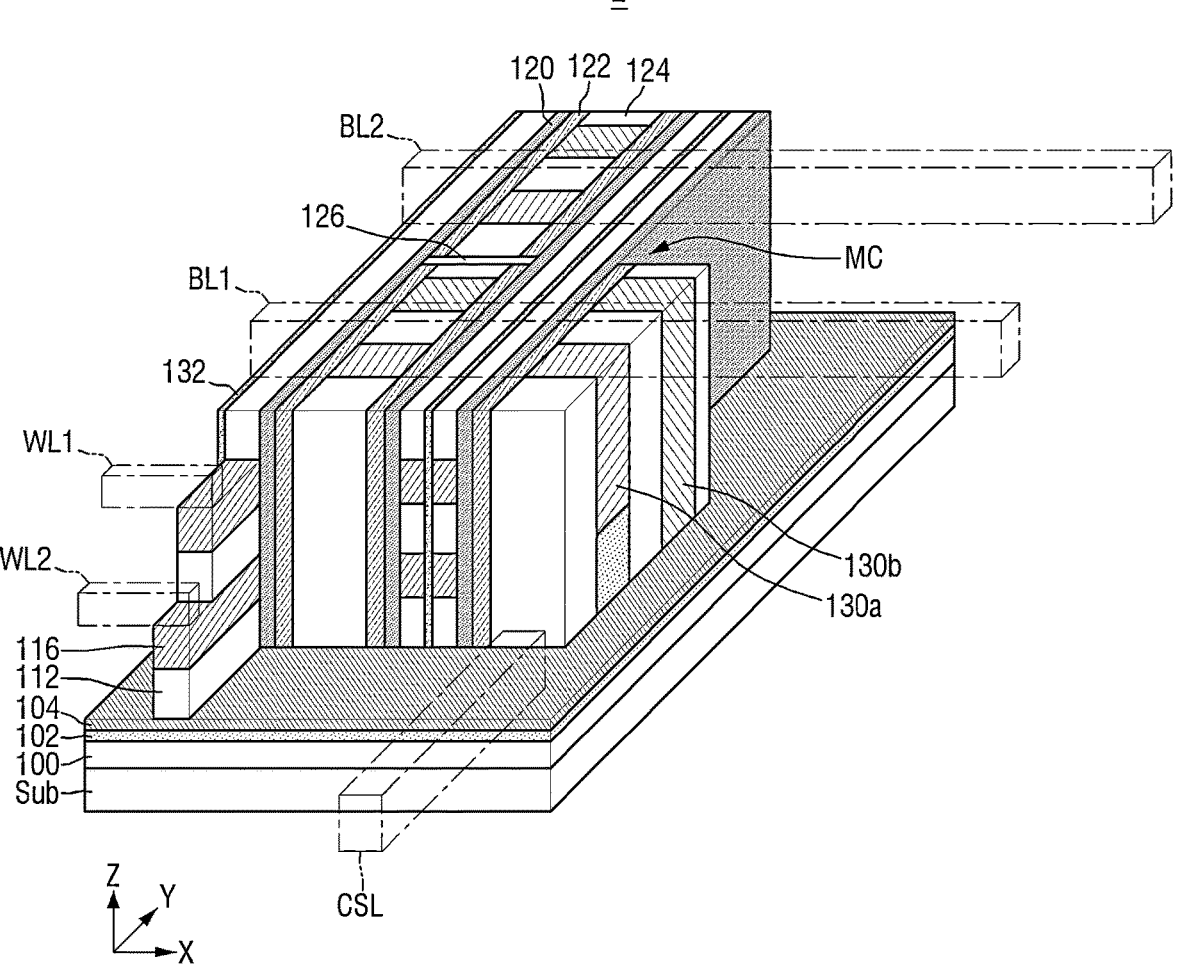

FIGS. 4 and 5 are exemplary perspective views showing a non-volatile memory device according to some embodiments.

Referring to FIG. 4, a non-volatile memory device 1 according to some embodiments may be on a substrate Sub.

The substrate Sub may include, e.g., a semiconductor substrate such as a silicon substrate, a germanium substrate or a silicon-germanium substrate. In an implementation, the substrate Sub may include, e.g., a silicon-on-insulator (SOI) substrate, a germanium-on-insulator (GOI) substrate, or the like.

An insulating layer 100 may be on the substrate Sub. In an implementation, the insulating layer 100 may include, e.g., silicon oxide.

A bit line isolation layer 102 may be on the insulating layer 100. In an implementation, the bit line isolation layer 102 may be, e.g., a layer of aluminum hydroxide (AlO). In an implementation, the bit line isolation layer 102 may isolate an electrical flow, and may have a fixed negative fixed charge characteristic.

A common source line conductive layer 104 may be on the bit line isolation layer 102. In an implementation, the common source line conductive layer 104 may include, e.g., doped polysilicon, metal, or metal nitride.

As described above, the substrate Sub, the insulating layer 100, the bit line isolation layer 102, and the common source line conductive layer 104 may be sequentially stacked in a third (e.g., vertical) direction Z.

In an implementation, thicknesses of the substrate Sub, the insulating layer 100, the bit line isolation layer 102, and the common source line conductive layer 104 may not be limited to those shown in this drawing.

An insulating pattern 112 and a conductive line 116 may be sequentially stacked on the common source line conductive layer 104 in the third direction Z. In an implementation, the insulating pattern 112 and the conductive line 116 may extend (e.g., lengthwise) in a second direction Y.

The insulating pattern 112 may include an insulating material. In an implementation, the insulating pattern 112 may include, e.g., silicon oxide.

The conductive line 116 may include a conductive material. In an implementation, the conductive line 116 may include, e.g., doped semiconductor materials (e.g., doped silicon, doped germanium, or the like), conductive metal nitrides (e.g., titanium nitride, tantalum nitride, or the like), metals (e.g., tungsten, titanium, tantalum, or the like), metal-semiconductor compounds (e.g., tungsten silicide, cobalt silicide, titanium silicide, or the like), or combinations thereof.

Each of the plurality of conductive lines 116 may be electrically connected to each of the plurality of word lines WL1 and WL2. In an implementation, the plurality of word lines WL1 and WL2 in FIG. 4 may serve as the word lines WL described in FIGS. 1 to 3.

A memory cell MC may be on the common source line conductive layer 104.

The memory cell MC may include, e.g., a plurality of the conductive lines 116, a plurality of the insulating patterns 112, a ferroelectric layer 120, a channel layer 122, a first conductive filler 130*a*, a second conductive filler 130*b*, and a first insulating layer 124.

The ferroelectric layer 120 may extend in the second direction Y, and may send and receive data to and from the plurality of conductive lines 116. In an implementation, the ferroelectric layer 120 may provide or receive electrons to or from the conductive line 116.

In an implementation, the ferroelectric layer 120 include, e.g., ferroelectrics such as barium titanate ($BaTiO_3$), lead zirconate titanate (PZT; $PbZrTiO_3$), strontium bismuth tantalate (STB; $SrBi_2Ta_2O_9$), bismuth iron oxide (BFO; $BiFeO_3$), or hafnium oxide ($HfO_2$).

In an implementation, when the ferroelectric layer 120 is a hafnium (Hf) oxide film, zirconate (Zr), silicon (Si), aluminum (Al), Wyler-based materials (Y), gadolinium (Gd), lanthanum (La), scandium (Sc), strontium (Sr), or the like may be included.

In an implementation, the ferroelectric layer 120 may be in a form in which two or more ferroelectric layers are combined, or in a form in which a ferroelectric layer and an insulating layer are combined. In an implementation, the combined form may be a laminated form.

The channel layer 122 may extend in the second direction Y, and may serve as a path through which data (e.g., electrons) stored in the ferroelectric layer 120 move. In an implementation, the data (e.g., electrons) stored in the ferroelectric layer 120 may exit the channel layer 122 and be transferred from the first conductive filler 130*a* to the second conductive filler 130*b*.

In an implementation, the first conductive filler 130*a* may serve as a drain electrically connected to the bit line BL described in FIGS. 1 to 3. The second conductive filler 130*b* may serve as a source electrically connected to the common source line CSL described in FIGS. 1 to 3.

In an implementation, the channel layer 122 may include, e.g., doped polysilicon, doped silicon, silicon germanium (SiGe) or a semiconductor material formed through a SEG (selective epitaxial growth), or may include an oxide semiconductor material. In an implementation, the oxide semiconductor material may include, e.g., IGZO, Sn-IGZO, IWO, $CuS_2$, $CuSe_2$, $WSe_2$, IZO, ZTO, or YZO. In an implementation, the channel layer 122 may include, e.g., $MoS_2$, $MoSe_2$ or $WS_2$.

The first conductive filler 130a and the second conductive filler 130b may extend in the third direction Z and may be spaced apart from each other in the second direction Y. In an implementation, the first conductive filler 130a and the second conductive filler 130b may include, e.g., doped semiconductor materials (e.g., doped silicon, doped germanium, or the like), conductive metal nitrides (e.g., titanium nitride, tantalum nitride, or the like), metals (e.g., tungsten, titanium, tantalum, or the like), metal-semiconductor compounds (e.g., tungsten silicide, cobalt silicide, titanium silicide, or the like), or combinations thereof.

The first insulating layer 124 may extend in the third direction Z and may electrically isolate between the first conductive filler 130a and the second conductive filler 130b. The first insulating layer 124 may include an insulating material. In an implementation, the first insulating layer 124 may include, e.g., silicon oxide.

The second insulating layer 126 may extend in the third direction Z to electrically isolate the plurality of memory cells MC. The second insulating layer 126 may include an insulating material. In an implementation, the second insulating layer 126 may include, e.g., silicon oxide.

The third insulating layer 132 may extend in the second direction Y, and may electrically insulate between, in a first direction X, a plurality of the insulating patterns 112 and a plurality of the conductive lines 116, which are connected to the plurality of memory cells MC and extend in the second direction Y. The third insulating layer 132 may include an insulating material. In an implementation, the third insulating layer 132 may include, e.g., silicon oxide.

A plurality of bit lines BL1 and BL2 may be electrically connected to the first conductive filler 130a. The plurality of bit lines BL1 and BL2 may extend in the first direction X and be spaced apart from each other in the second direction Y.

A common source line CSL may be electrically connected to the common source line conductive layer 104. The common source line CSL may extend in the first direction X.

A ground GND may be applied to the second conductive filler 130b of the non-volatile memory device 1 according to some embodiments through one common source line CSL electrically connected to the common source line conductive layer 104.

In an implementation, the non-volatile memory device according to some embodiments may apply the ground GND to the plurality of common source lines CSL with only one common source line CSL to drive the ferroelectric field effect transistors.

In an implementation, the plurality of common source lines CSL connected to a plurality of memory cells MC of the non-volatile memory device may be combined into one through the common source line conductive layer 104, and the number of common source lines CSL formed in the BEOL process may be reduced.

Accordingly, the process efficiency may be improved, by reducing the complexity when forming the common source line in the BEOL process of the non-volatile memory device according to some embodiments.

In an implementation, the placement of the plurality of word lines WL1 and WL2, the plurality of bit lines BL1 and BL2, and the common source line may be different from those illustrated in FIG. 4.

In an implementation, the common source line CSL may extend in the second direction Y as in the non-volatile memory device 2 illustrated in FIG. 5 according to some embodiments.

In an implementation, the first conductive filler 130a may be electrically insulated from the common source line conductive layer 104 by the bit line isolation layer 102, and it may not be affected by the voltage applied through the common source line CSL.

The structure in which the first conductive filler 130a and the second conductive filler 130b are on the common source line conductive layer 104 will be explained in detail through cross-sectional views with reference to FIGS. 6 to 9 below.

In order to simplify the explanation, the repeated explanation of contents explained above may not be provided.

FIGS. 6 to 9 are cross-sectional views of the non-volatile memory device of FIG. 4 taken along line A-A' and viewed in or along the first direction X.

Figure 6:
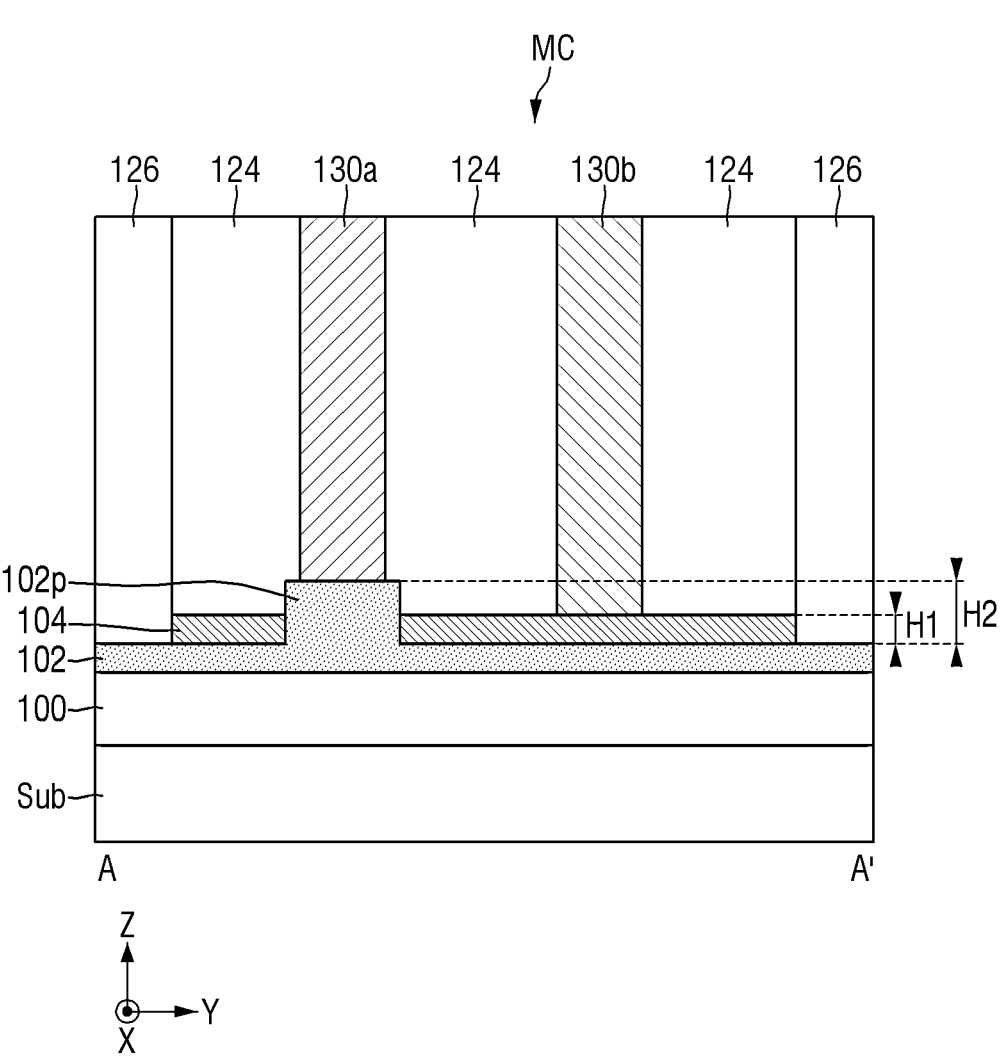
FIGS. 6 to 9 are cross-sectional views of the non-volatile memory device of FIG. 4 taken along line A-A' and viewed in the first direction X.

Referring to FIG. 6, the substrate Sub, the insulating layer 100, and the bit line isolation layer 102 may be sequentially formed or stacked in the third direction Z.

In an implementation, the bit line isolation layer 102 may include a bit line isolation layer protrusion 102p that protrudes (e.g., upwardly) in the third direction Z.

The bit line isolation layer protrusion 102p may penetrate the common source line conductive layer 104 on the bit line isolation layer 102.

In an implementation, a height H2 of the bit line isolation layer protrusion 102p in the third direction Z may be higher than a height H1 of the common source line conductive layer 104 in the third direction Z.

The first insulating layer 124 may surround the first conductive filler 130a and the second conductive filler 130b to electrically insulate between the first conductive filler 130a and the second conductive filler 130b.

In an implementation, the first conductive filler 130a may be on the bit line isolation layer protrusion 102p and may be insulated from electrical signals applied through the common source line conductive layer 104.

In an implementation, the second insulating layer 126 may surround the first insulating layer 124, thereby electrically isolating the plurality of memory cells MC. In an implementation, the second insulating layer 126 may penetrate the common source line conductive layer 104 and be on the bit line isolation layer 102.

Figure 7:
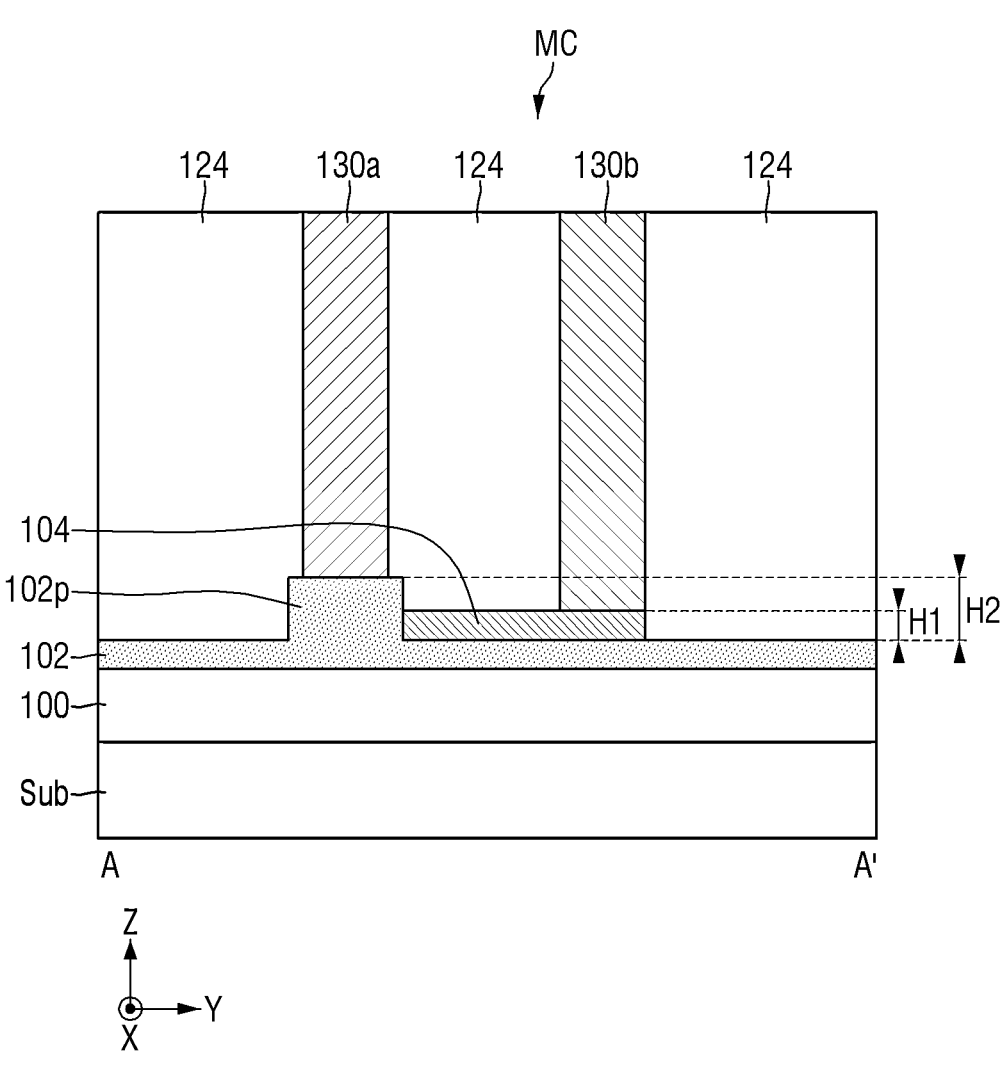

Referring to FIG. 7, as another example, at least a part of the first insulating layer 124 may be on the bit line isolation layer 102, and at least another part of the first insulating layer 124 may be on the common source line conductive layer 104 at the same time.

Figure 8:
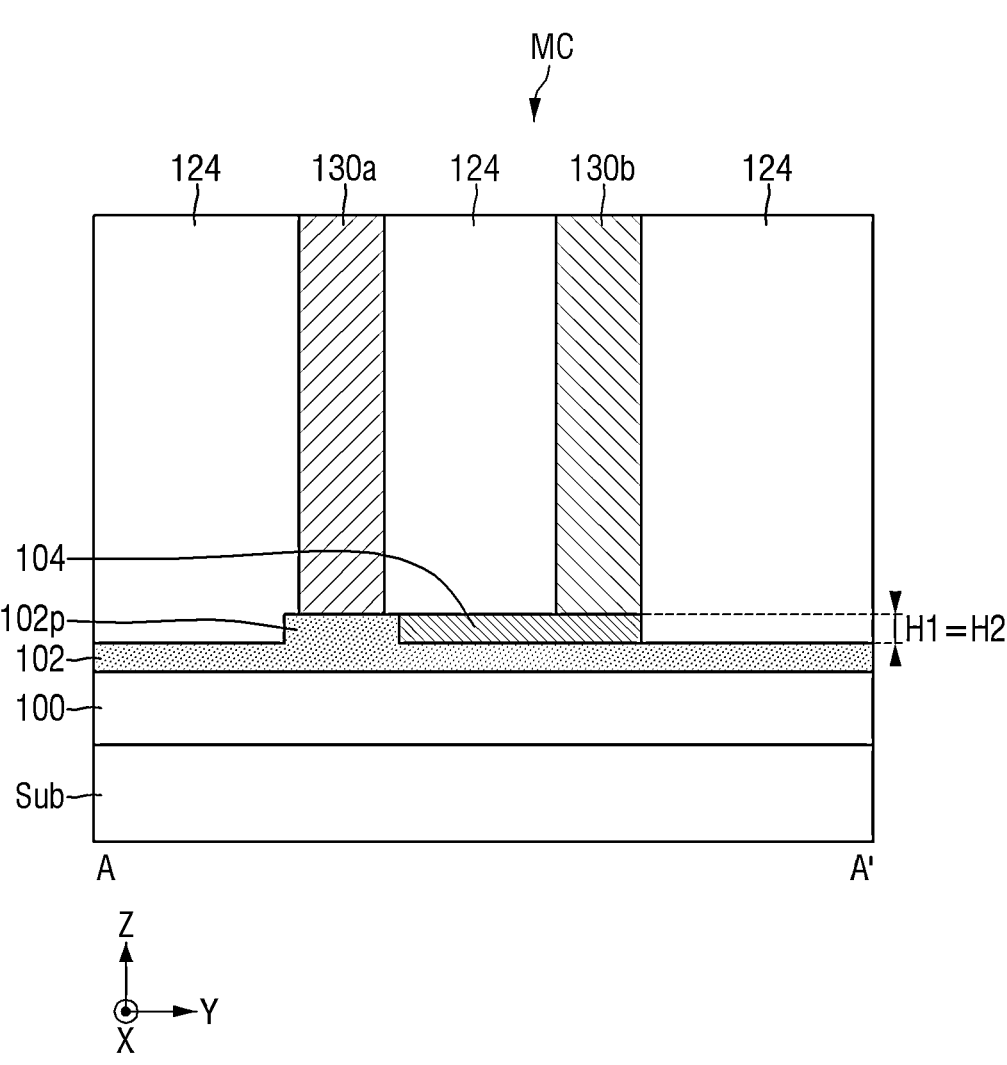

Referring to FIG. 8, as another example, unlike FIG. 7, the height H2 of the bit line isolation layer protrusion 102p in the third direction Z may be the same as the height H1 of the common source line conductive layer 104 in the third direction Z.

In an implementation, this example may also be applied to FIG. 6.

Figure 9:
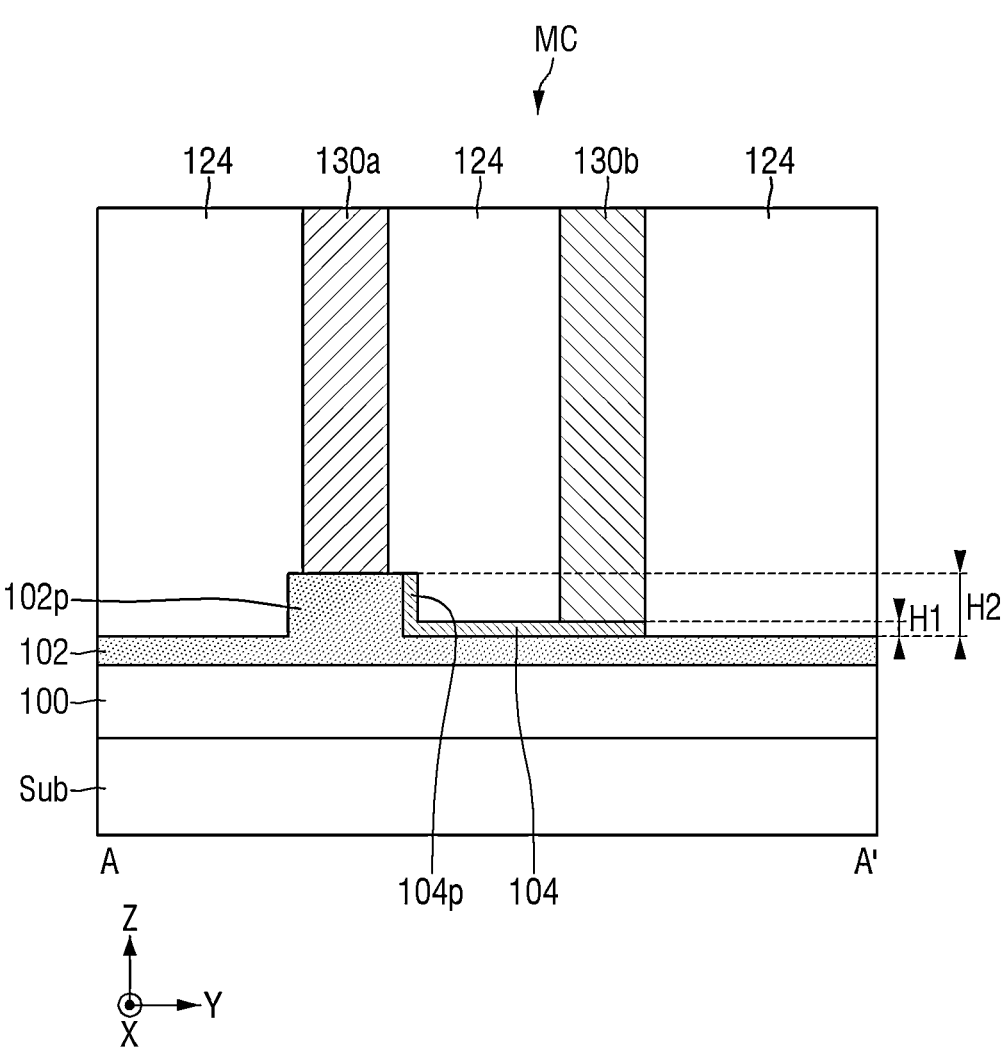

Referring to FIG. 9, as another example, the common source line conductive layer 104 may further include a common source line conductive layer protrusion 104p along a side wall of the bit line isolation layer protrusion 102p, which may protrude in the third direction Z.

A method of fabricating a non-volatile memory device according to some embodiments will be described below in detail through intermediate step diagrams.

For reference, the repeated explanation of contents explained above may not be provided to simplify the explanation.

FIGS. 10 to 38 are exemplary views showing stages in a method of fabricating the non-volatile memory device according to some embodiments.

Figure 10:
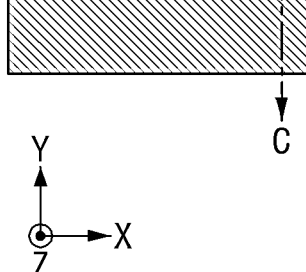
FIGS. 10 to 38 are exemplary views of stages in a method of fabricating the non-volatile memory device according to some embodiments.
Figure 11:
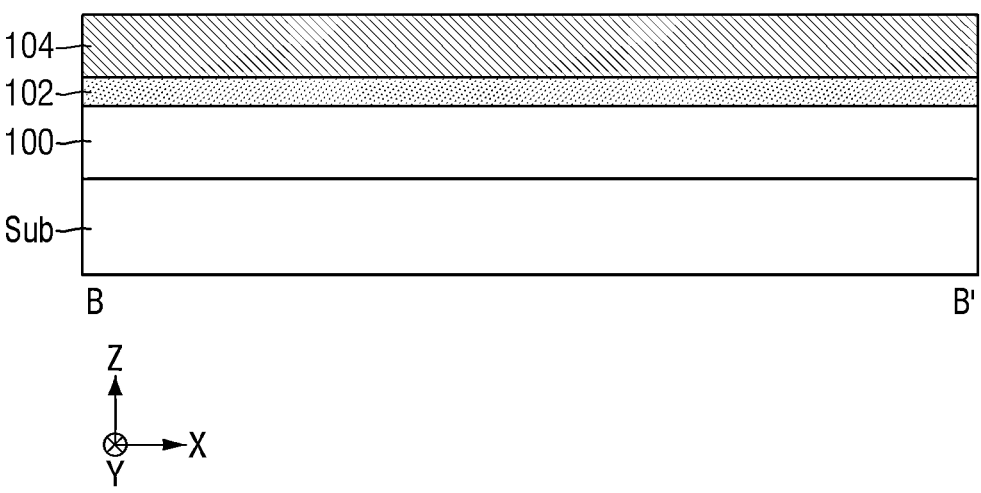
Figure 12:
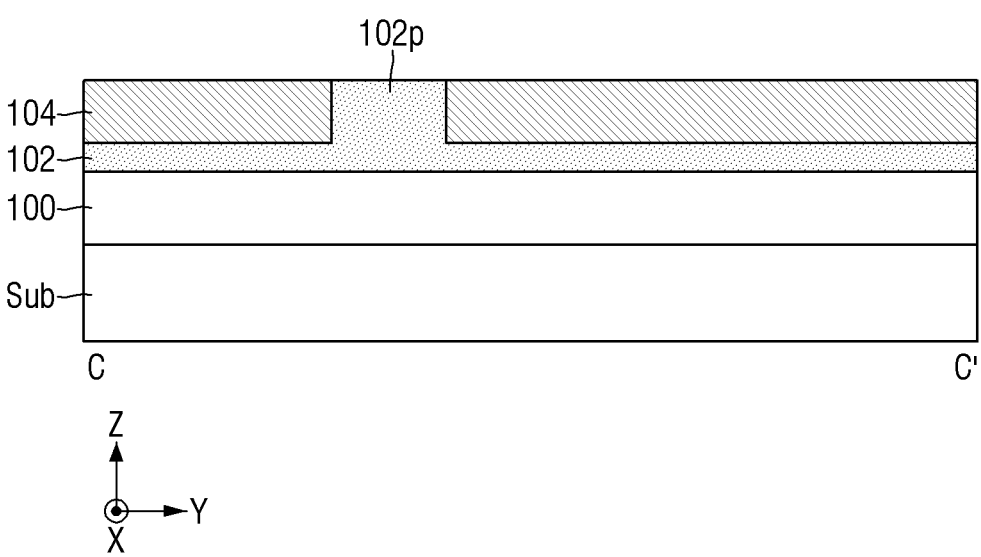

FIGS. 10 to 12 are exemplary views showing the same intermediate steps of fabricating the non-volatile memory device according to some embodiments.

The substrate Sub, the insulating layer 100, the bit line isolation layer 102, and the common source line conductive layer 104 may be sequentially formed in the third direction Z.

In an implementation, the bit line isolation layer protrusion 102p penetrating at least part of the common source line conductive layer 104 may be formed to protrude from the bit line isolation layer 102. The bit line isolation layer protrusion 102p may protrude in the third direction Z and extend in the first direction X.

In an implementation, after sequentially forming the substrate Sub, the insulating layer 100, and the bit line isolation layer 102, the bit line isolation layer protrusion 102p may be formed through an etching process, and the common source line conductive layer 104 may be formed on the bit line isolation layer 102.

Figure 13:
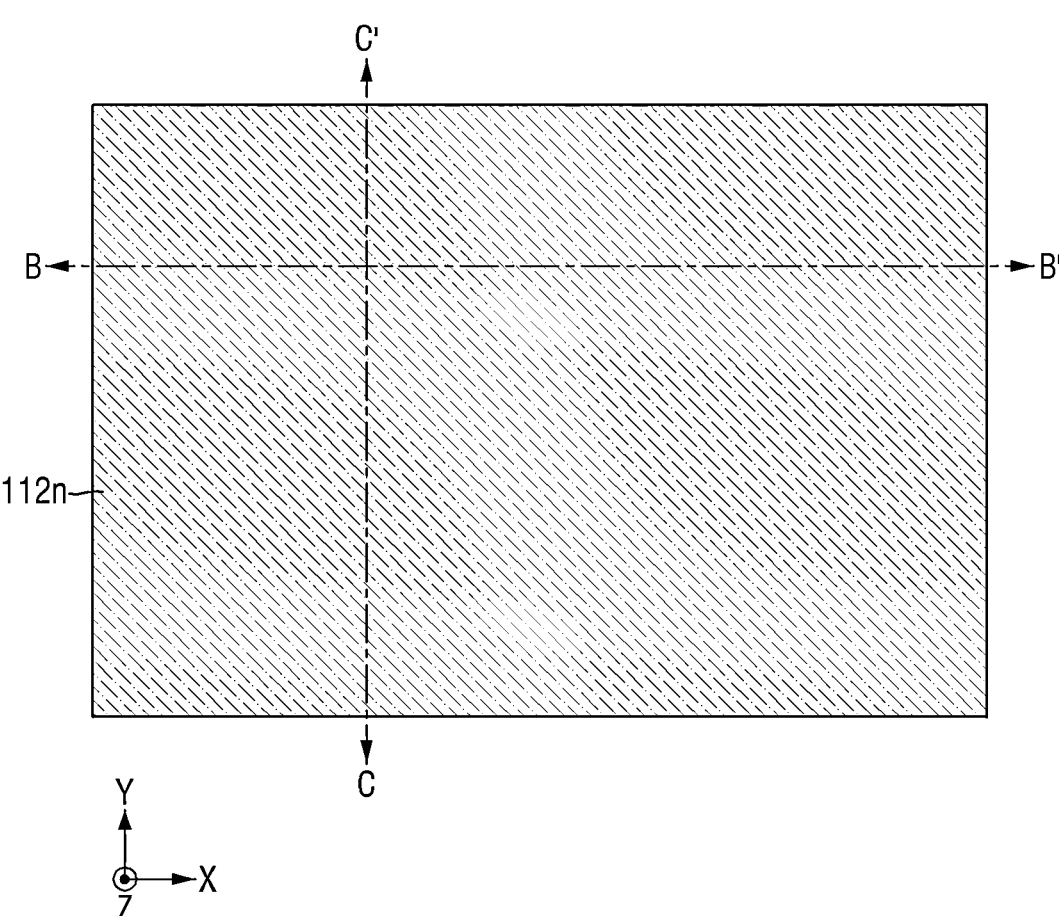
Figure 14:
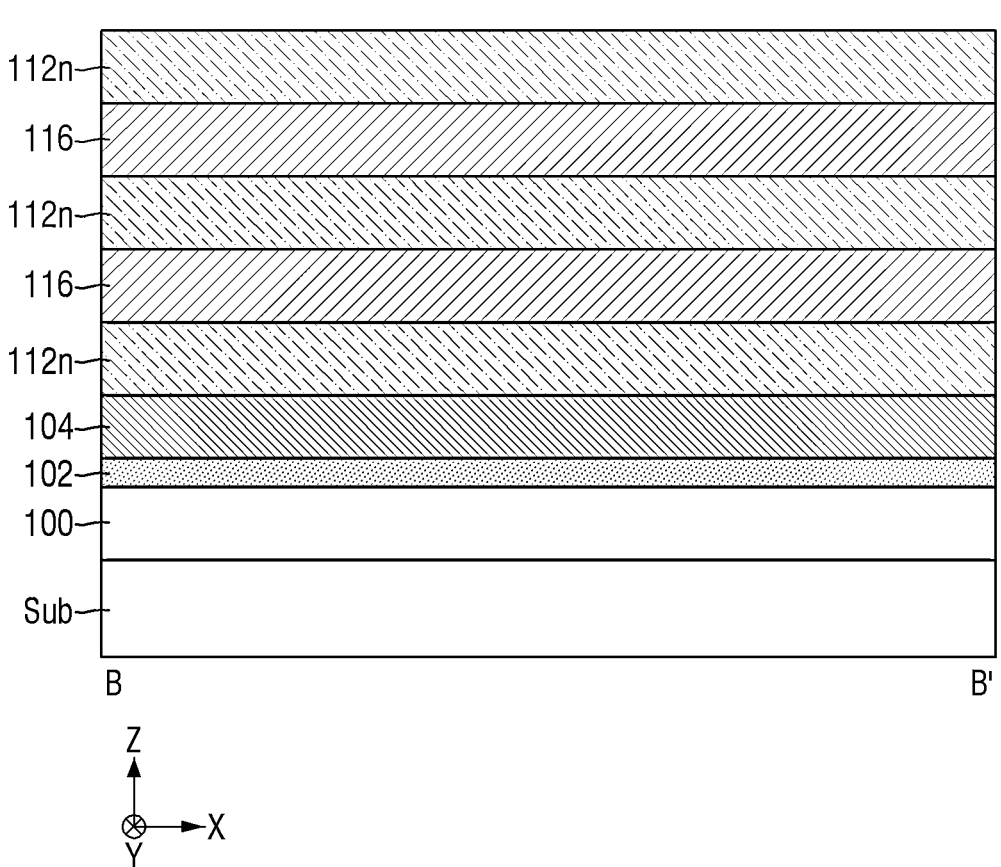
Figure 15:
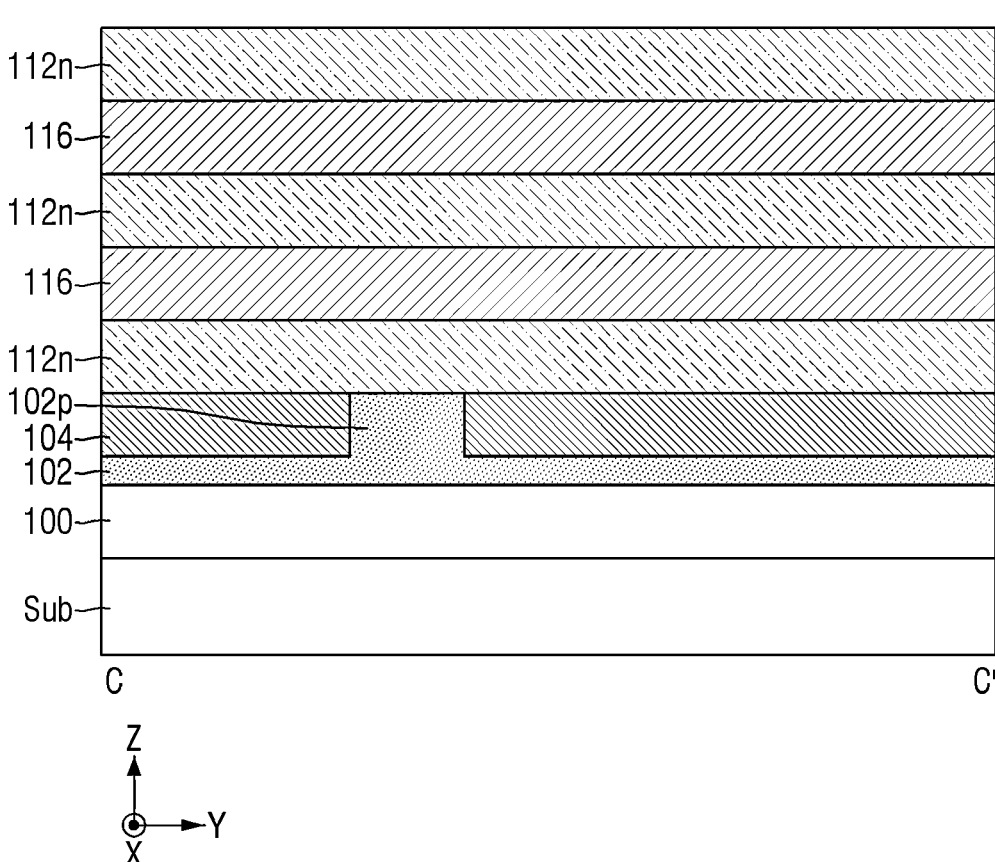

Referring to FIGS. 13 to 15, a sacrificial layer 112n and a conductive line 116 may be sequentially stacked on the bit line isolation layer 102 and the common source line conductive layer 104 in the third direction Z. In an implementation, a number of alternately stacked sacrificial layers 112n and conductive lines 116 may vary. In an implementation, thicknesses of the sacrificial layer 112n and the conductive line 116 may be different from those shown in this drawing.

In an implementation, the sacrificial layer 112n may include, e.g., silicon nitride, silicon oxynitride, silicon-rich nitride (Si-rich nitride), or nanocrystalline silicon (nanocrystalline Si). For convenience of explanation, a case where silicon nitride is included will be described below.

In an implementation, the sacrificial layer 112n may be formed on the bit line isolation layer protrusion 102p and the common source line conductive layer 104.

Figure 16:
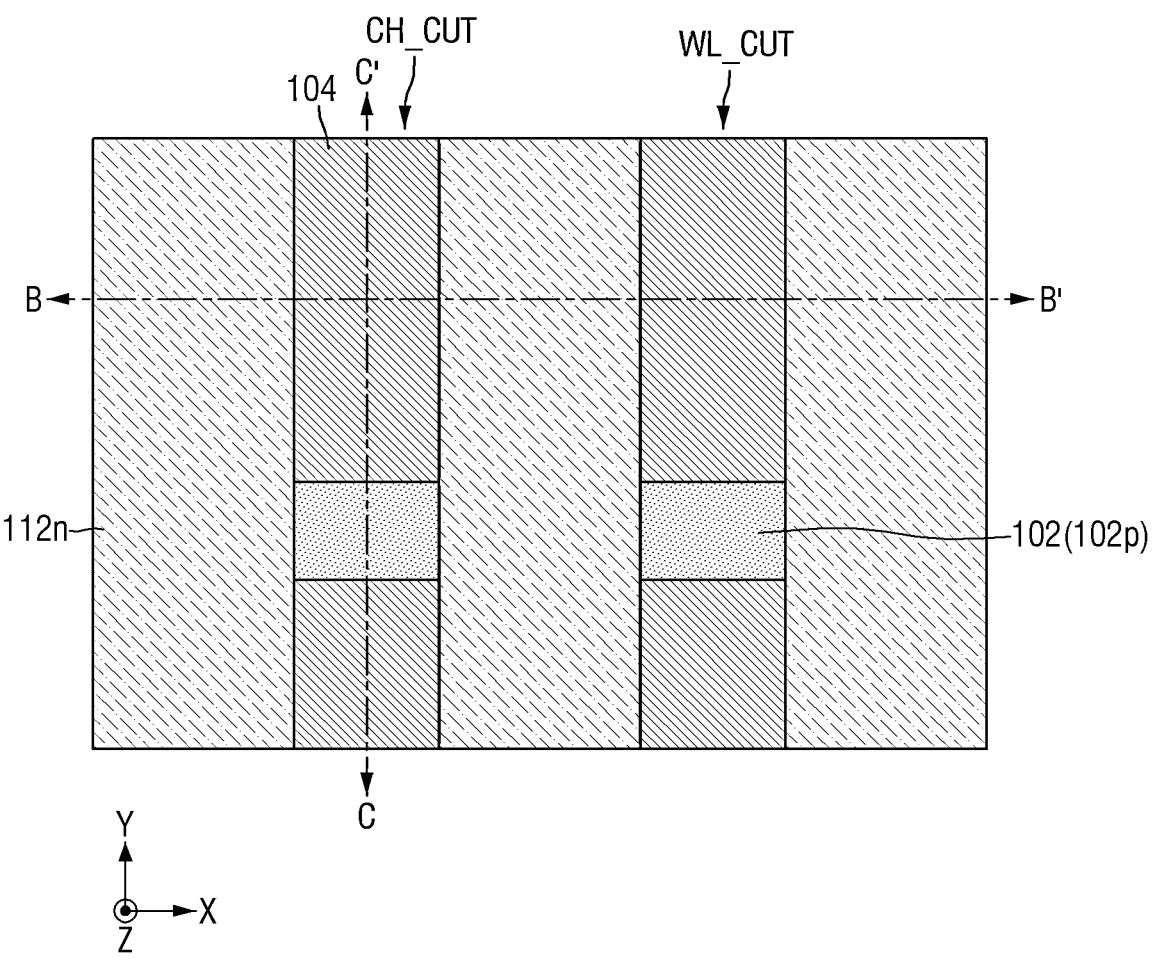
Figure 17:
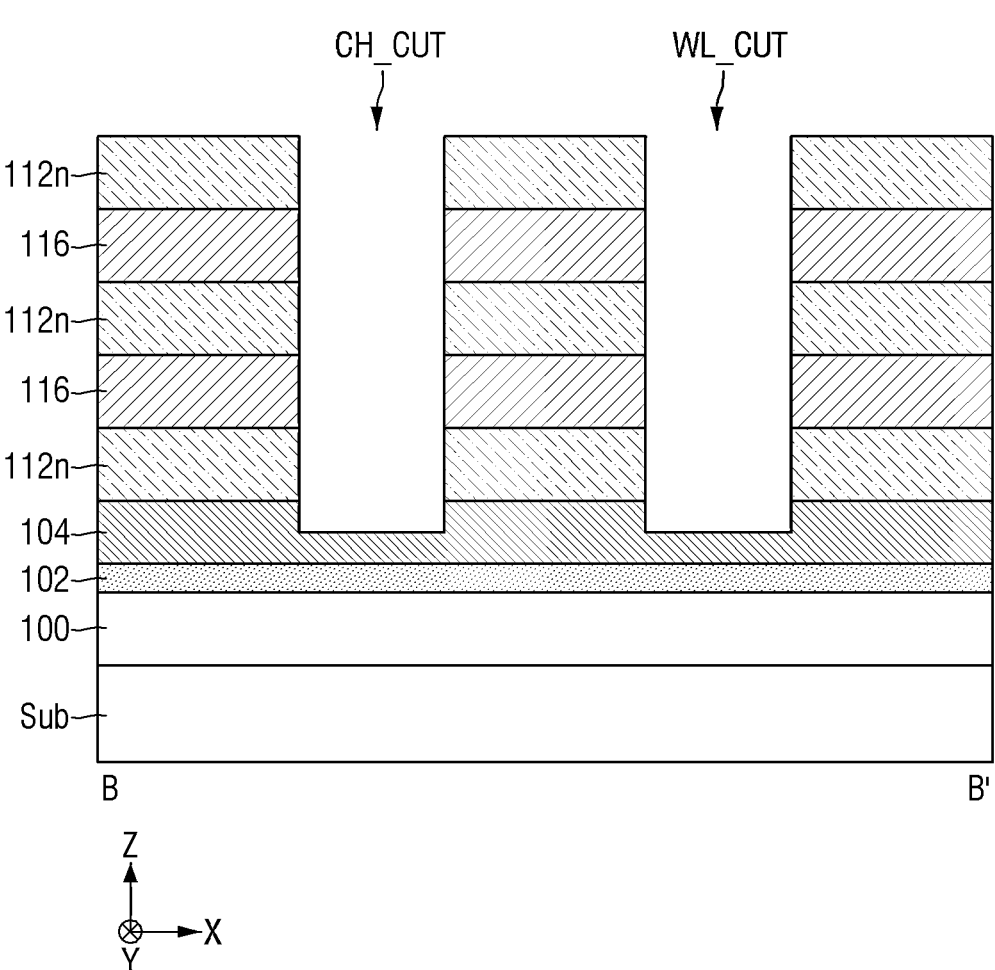
Figure 18:
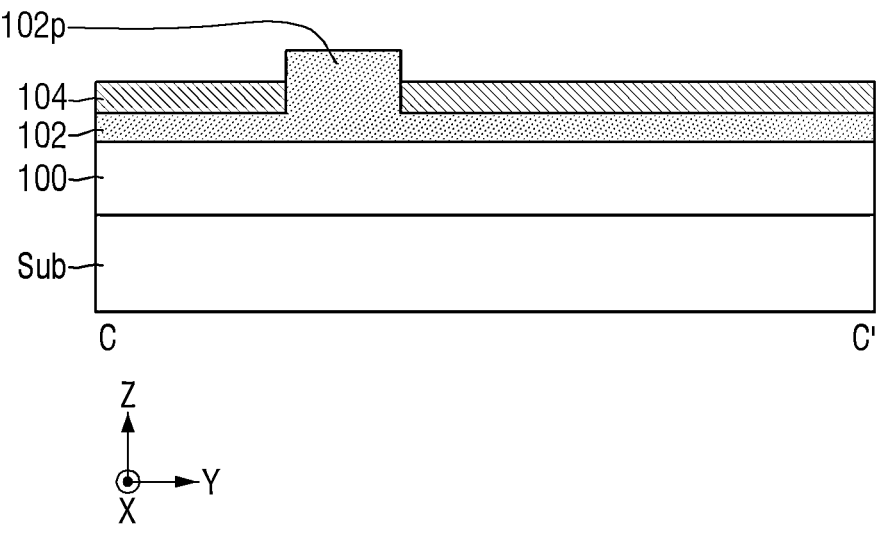

Referring to FIGS. 16 to 18, a channel cut CH_CUT may be formed by etching the sacrificial layer 112n and the conductive line 116 stacked in the third direction Z, and by etching at least a part of the common source line conductive layer 104. In an implementation, a word line cut WL_CUT may be formed by etching the sacrificial layer 112n and the conductive line 116 stacked in the third direction Z, and by etching at least a part of the common source line conductive layer 104.

The etching order of the channel cut CH_CUT and the word line cut WL_CUT may be selected arbitrarily. In an implementation, after forming the etching for forming the channel cut CH_CUT, the etching for forming the word line cut WL_CUT may be performed, and the etching may be performed in the reverse order or at the same time.

As will be described in greater detail below, the memory cell MC may be formed through the channel cut CH_CUT, and the sacrificial layer 112n may be removed through the word line cut WL_CUT.

The channel cut CH_CUT and the word line cut WL_CUT may have a pillar shape. In an implementation, they may be formed in a cup shape. In an implementation, they may have a tapered shape. In an implementation, the channel cut CH_CUT and the word line cut WL_CUT may narrow downwardly in the third direction Z. This may be due to the characteristics of the etching process for forming the channel cut CH_CUT and the word line cut WL_CUT. In an implementation, the shapes of the channel cut CH_CUT and the word line cut WL_CUT may vary.

In an implementation, the bit line isolation layer protrusion 102p may be exposed through the channel cut CH_CUT. In an implementation, the bit line isolation layer protrusion 102p may be formed to penetrate the common source line conductive layer 104.

Figure 19:
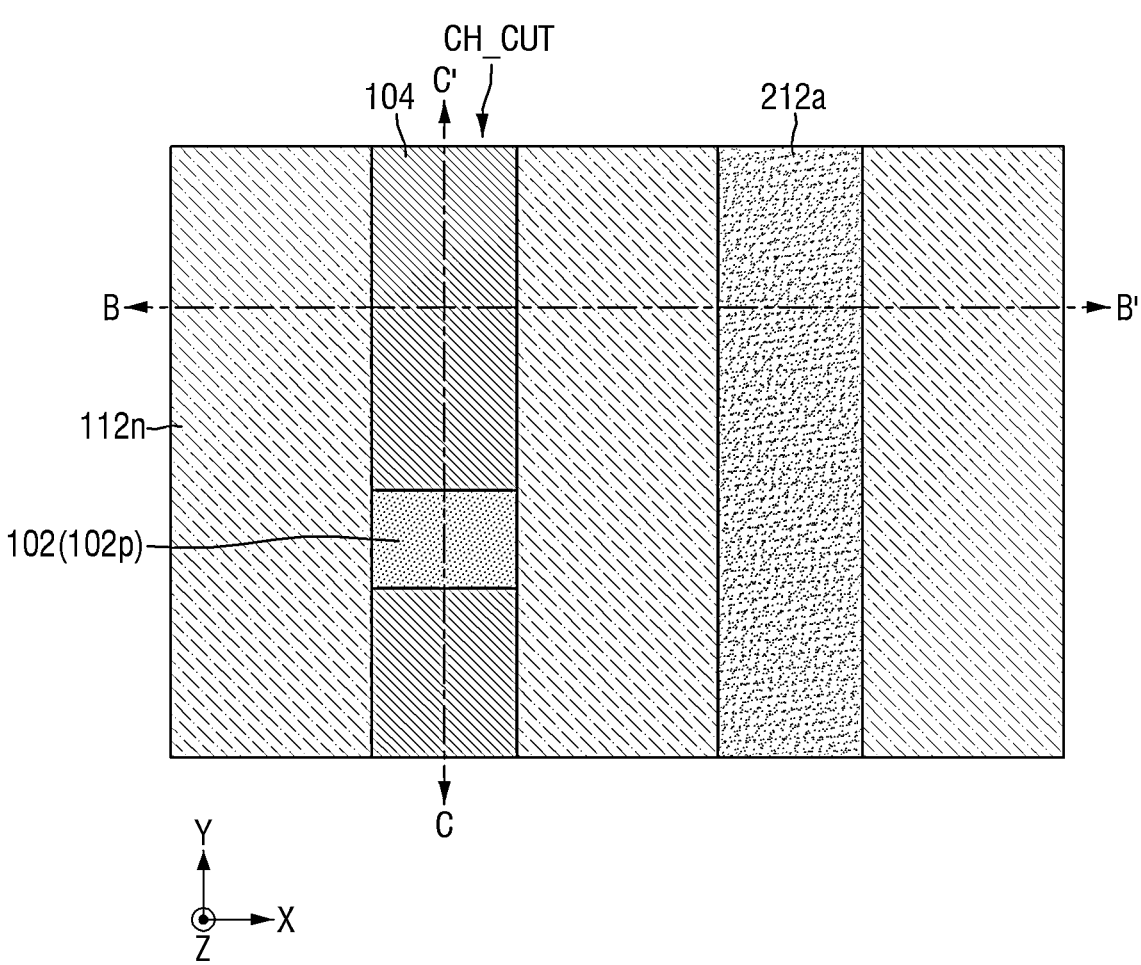
Figure 20:
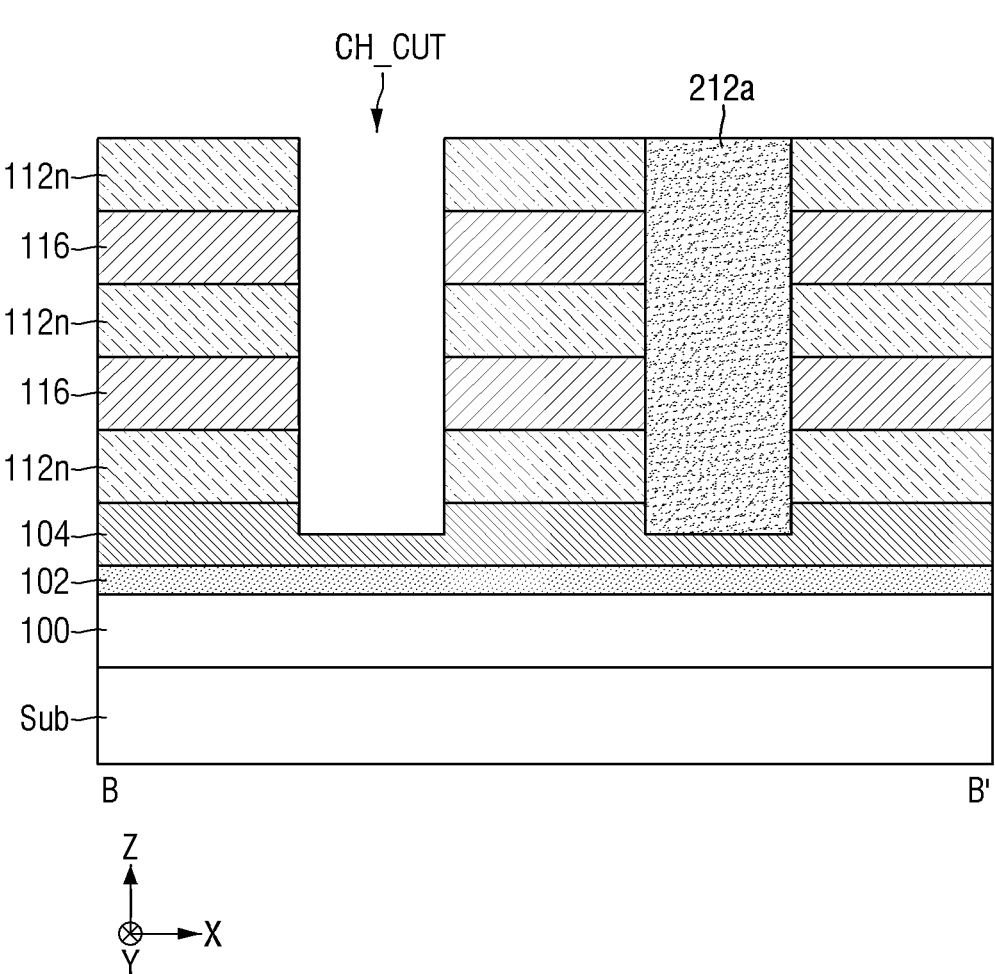

Referring to FIGS. 19 and 20, an insulating pattern 212a including an insulating material may be formed in the word line cut WL_CUT. In an implementation, the insulating material for forming the insulating pattern 212a may include, e.g., silicon oxide.

Figure 21:
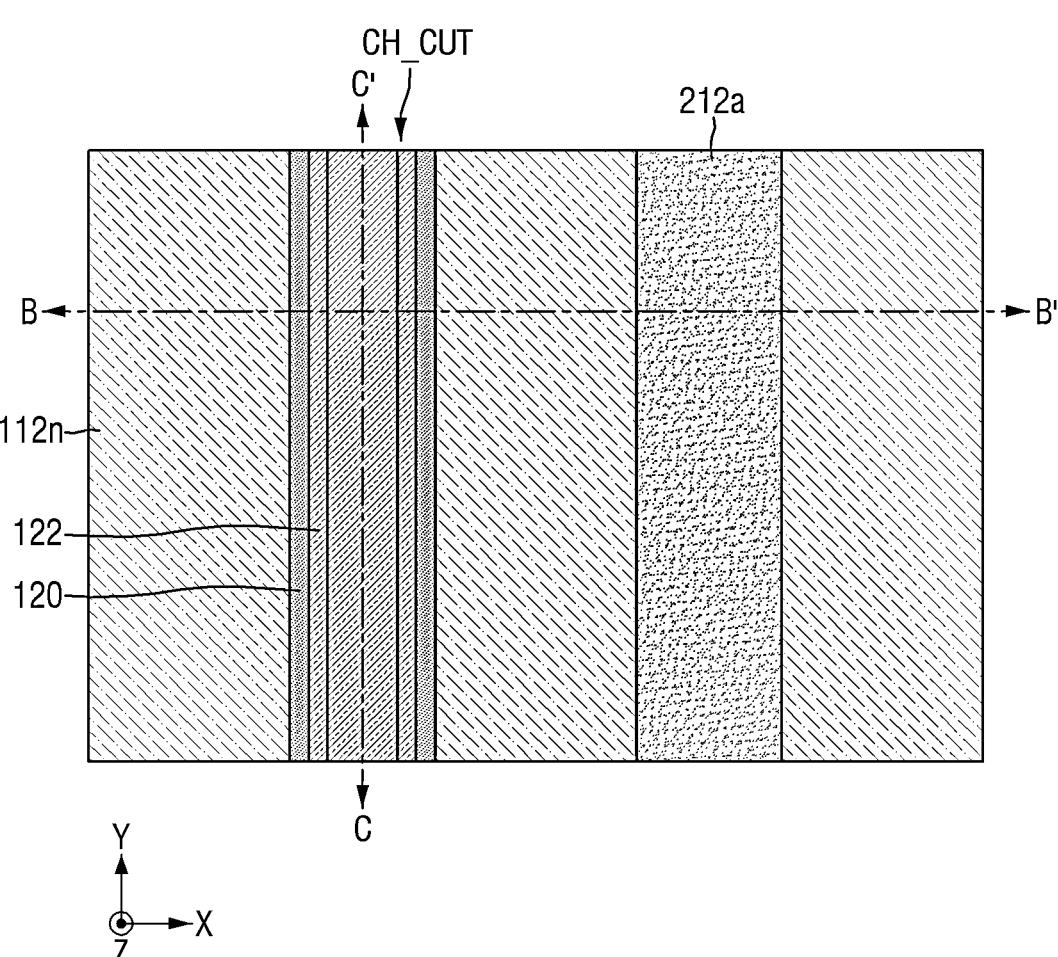
Figure 22:
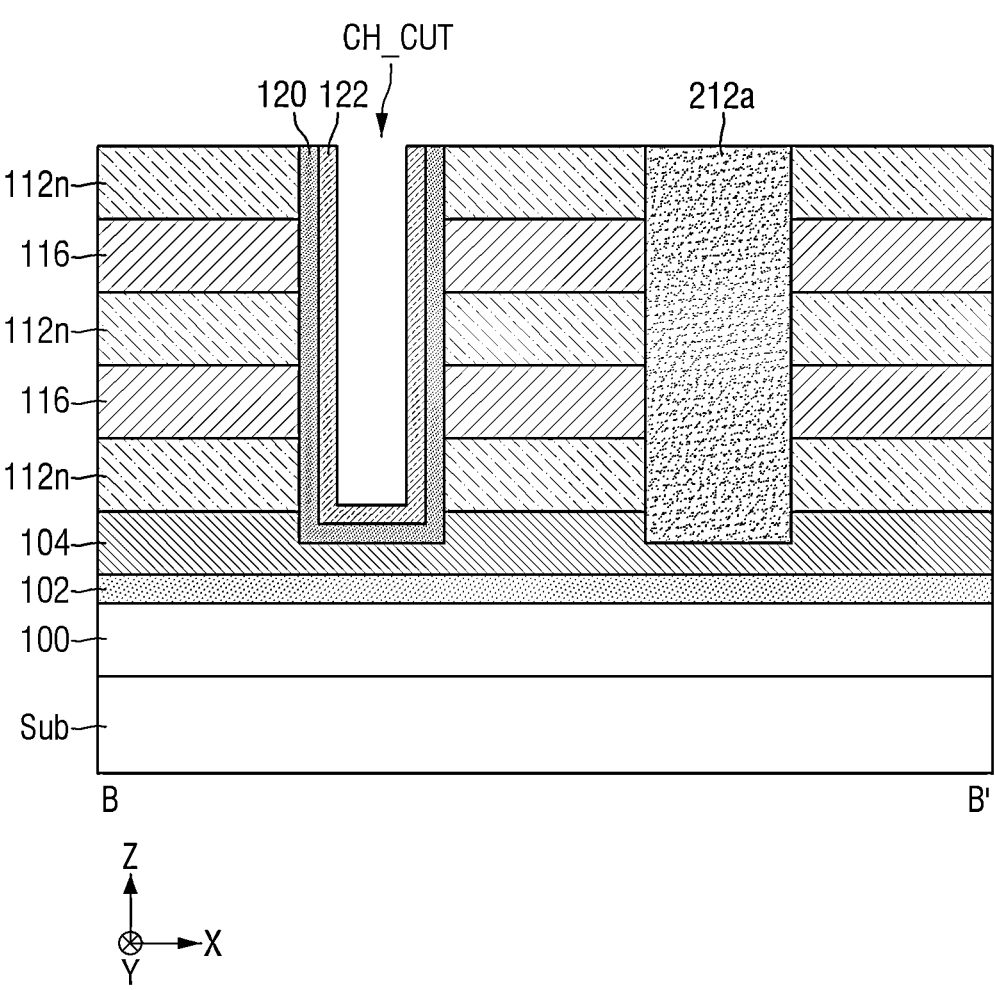
Figure 23:
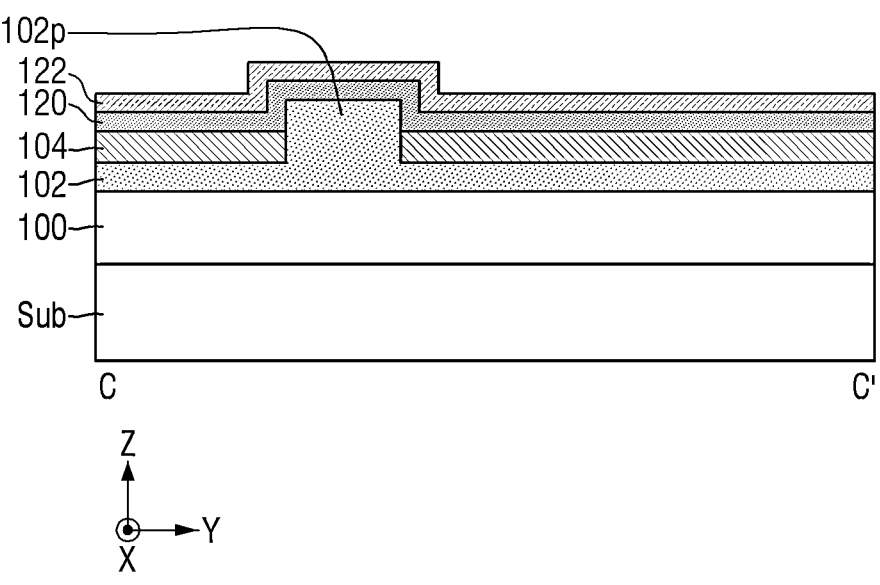
Figure 24:
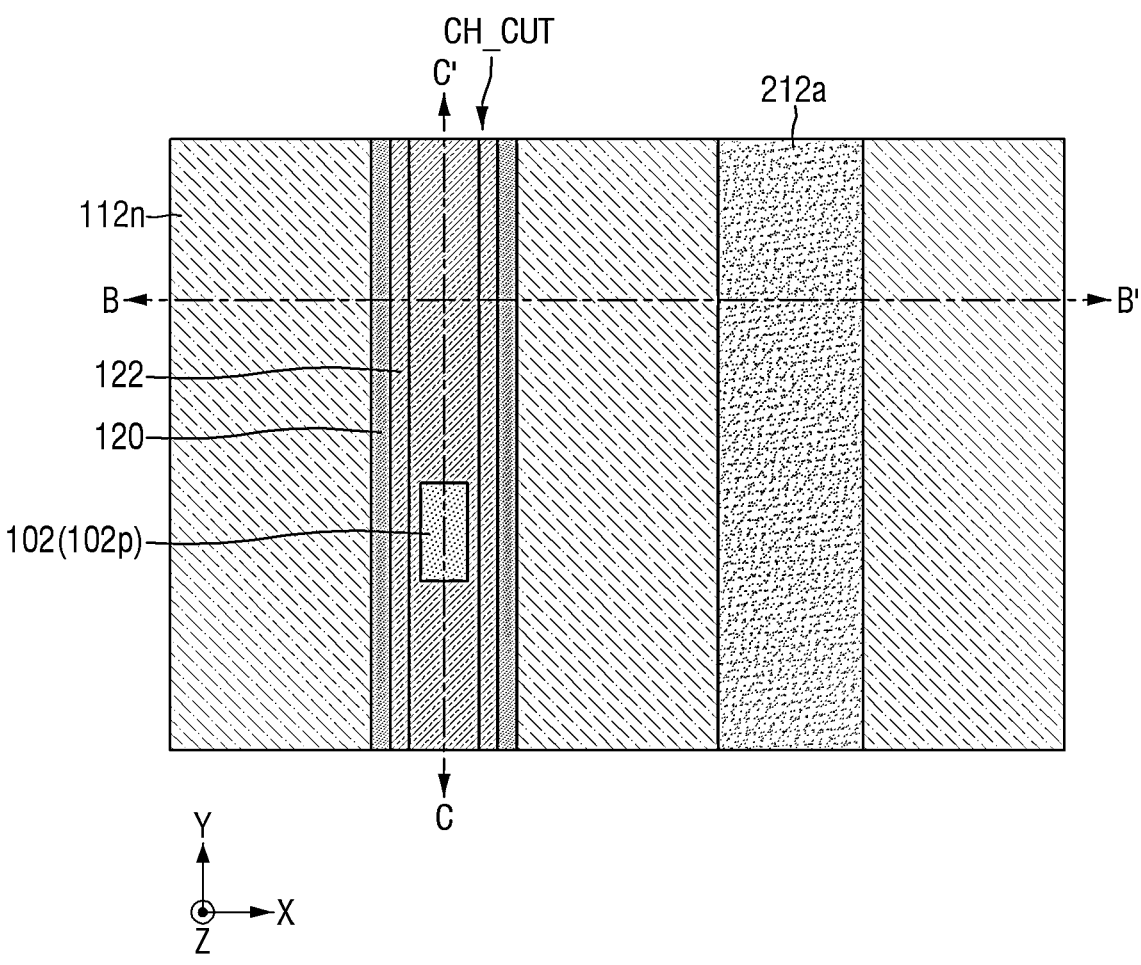
Figure 25:
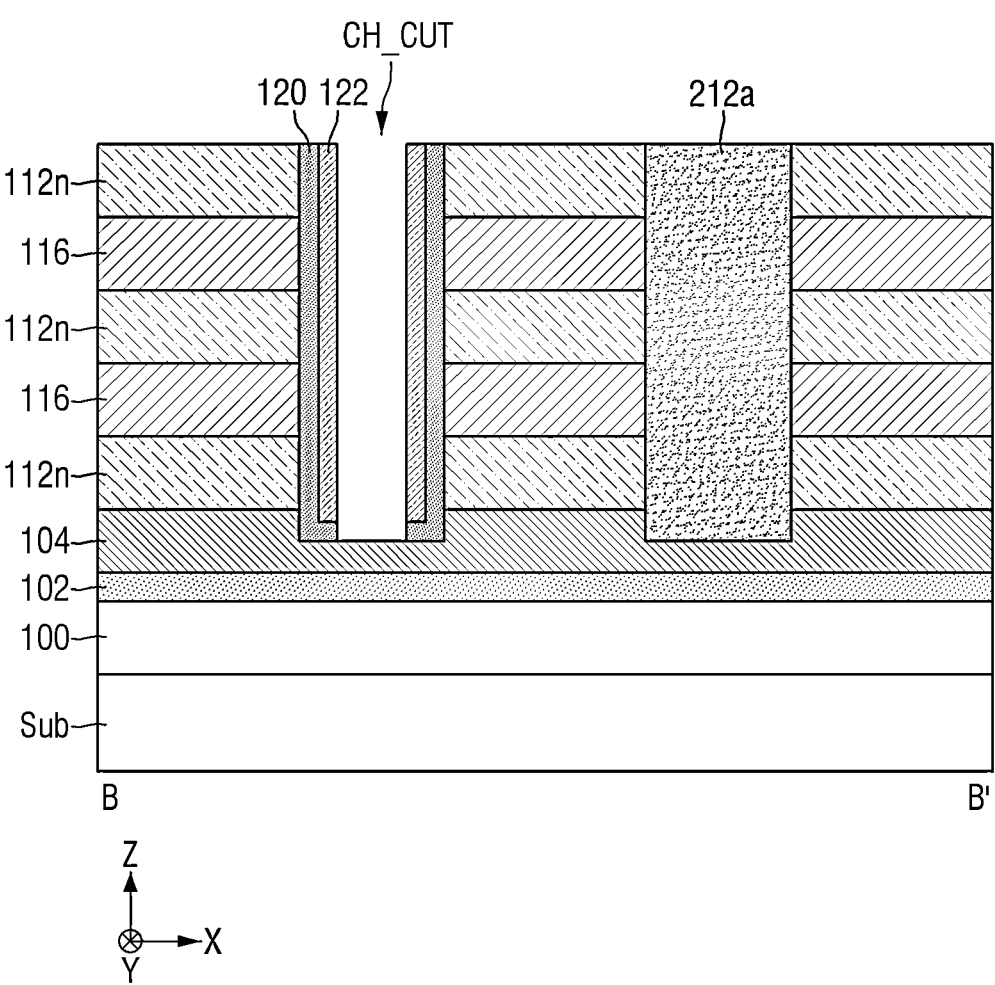

Referring to FIGS. 21 to 23, a ferroelectric layer 120 and a channel layer 122 may be sequentially deposited in the channel cut CH_CUT region.

In an implementation, the ferroelectric layer 120 may be deposited along the bottom and side walls of the channel cut CH_CUT region. In an implementation, the ferroelectric layer 120 may be conformally deposited along the bottom and side walls of the channel cut CH_CUT region. In an implementation, the ferroelectric layer 120 may be formed on the common source line conductive layer 104 and the bit line isolation layer protrusion 102p. In an implementation, the ferroelectric layer 120 may be formed along the side walls of the bit line isolation layer protrusion 102p.

The channel layer 122 may also be deposited on the ferroelectric layer 120. In an implementation, the channel layer 122 may be conformally deposited along the ferroelectric layer 120.

In an implementation, before depositing the ferroelectric layer 120 on the channel cut CH_CUT, a barrier film, e.g., a nitride, may be first deposited along the side walls and bottom of the channel cut CH_CUT, and then, the ferroelectric layer 120 and the channel layer 122 may be sequentially deposited.

Referring to FIGS. 24 to 27, at least a part of the bottom of the ferroelectric layer 120 and the channel layer 122 along the side walls of the channel cut CH_CUT may be etched.

In an implementation, at least a part of lowermost ends of the ferroelectric layer 120 and the channel layer 122 in the third direction Z may be etched to expose the common source line conductive layer 104. In an implementation, at least a part of the lowermost ends of the ferroelectric layer 120 and the channel layer 122 in the third direction Z may be etched to expose the bit line isolation layer 102, e.g., the bit line isolation layer protrusion 102p.

In this process, the ferroelectric layer 120 and the channel layer 122 may remain along the side walls of the bit line isolation layer protrusion 102p. This is because the thicknesses of the ferroelectric layer 120 and the channel layer 122 may differ depending on the position, and portions that are not etched in the etching process may remain.

Figure 27:
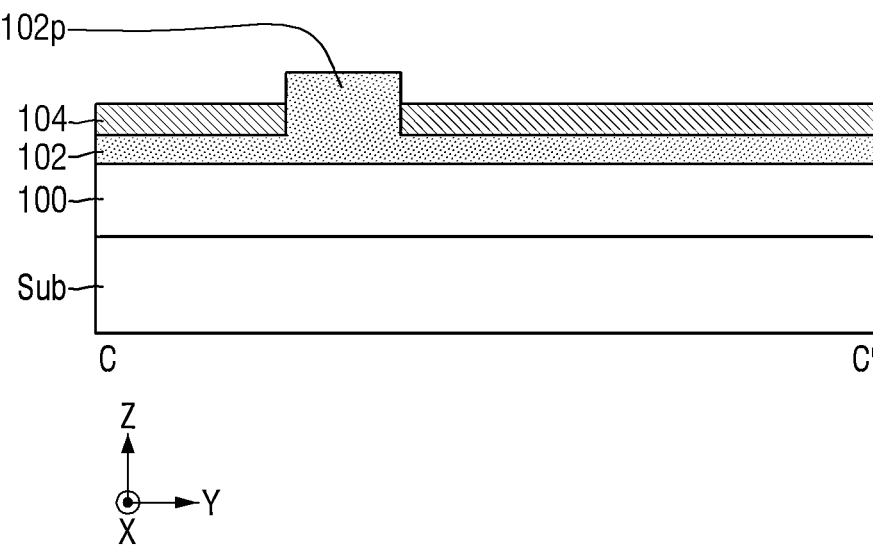

In an implementation, as shown in FIG. 27, etching may be performed so that the ferroelectric layer 120 and the channel layer 122 are also removed from the side walls of the bit line isolation layer protrusion 102p.

Figure 26:
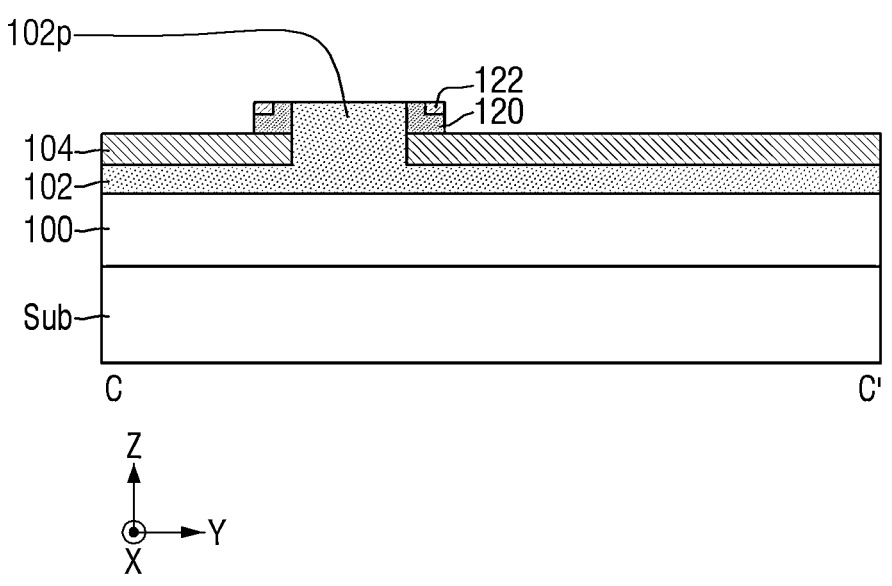

Hereinafter, a case where the ferroelectric layer 120 and the channel layer 122 remain along the side walls of the bit line isolation layer protrusion 102p will be assumed as in FIG. 26.

Figure 28:
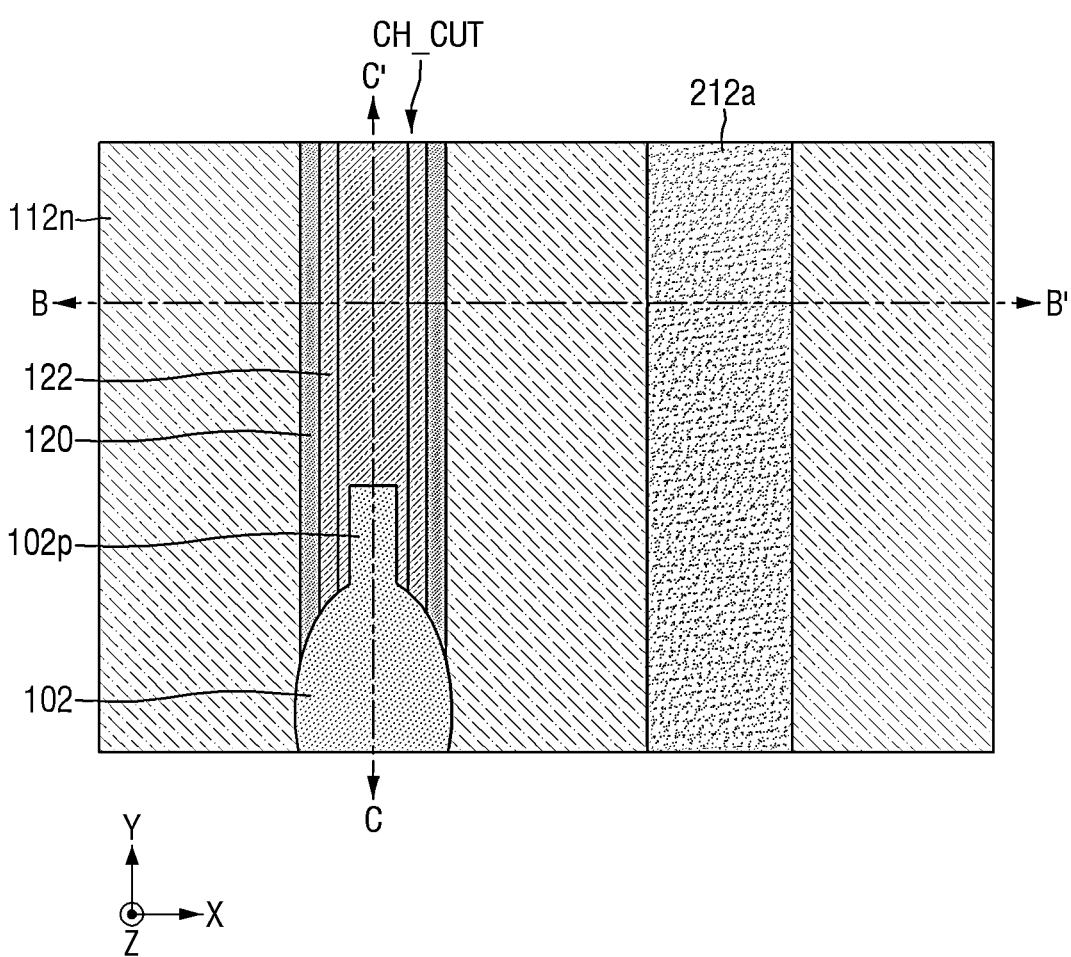
Figure 29:
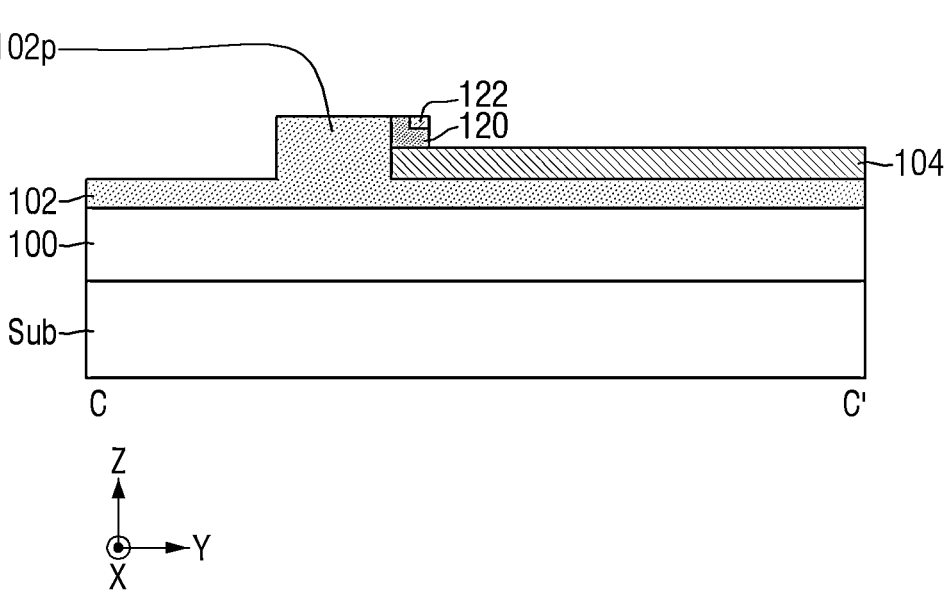

Referring to FIGS. 28 and 29, the common source line conductive layer 104, the ferroelectric layer 120 and the channel layer 122 on one side wall of the bit line isolation layer protrusion 102p may be etched. This is to electrically insulate between the memory cell generated through the bit line isolation layer protrusion 102p and other memory cell.

Figure 30:
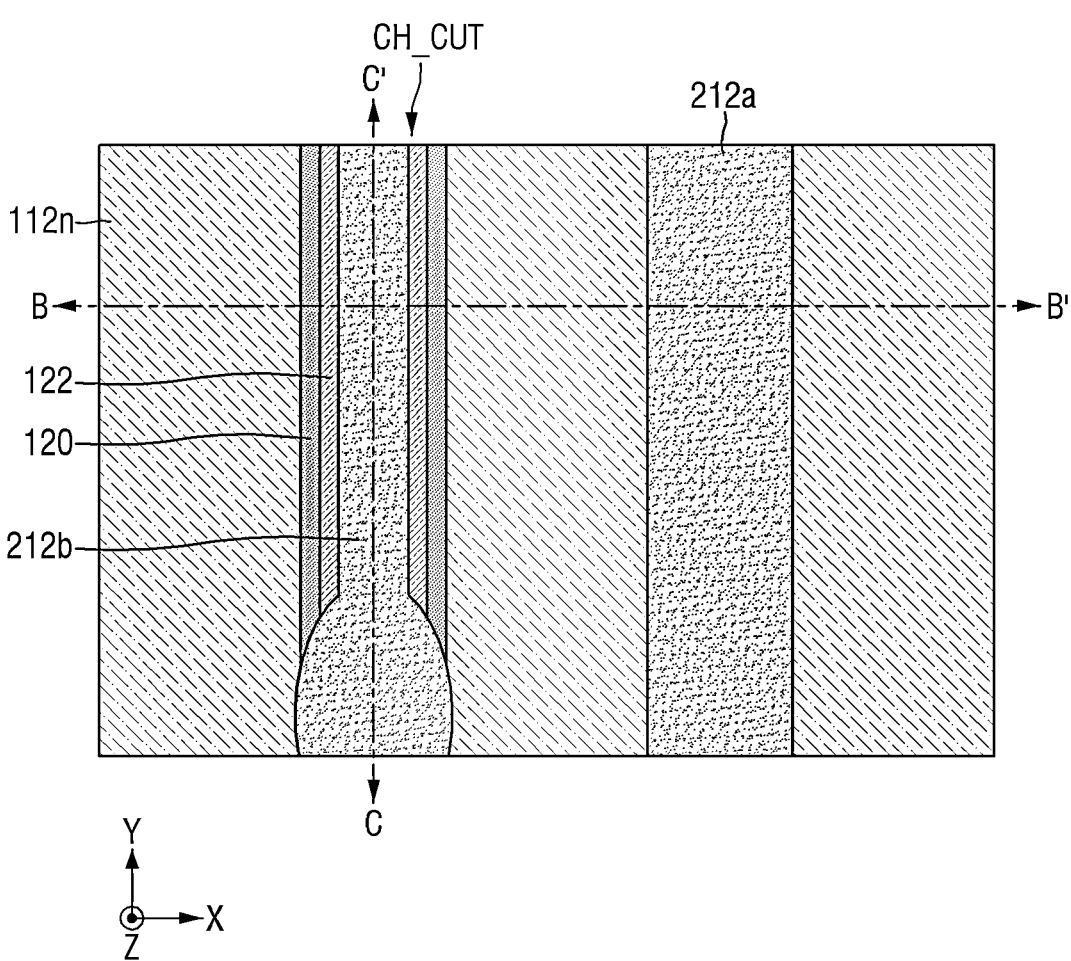
Figure 31:
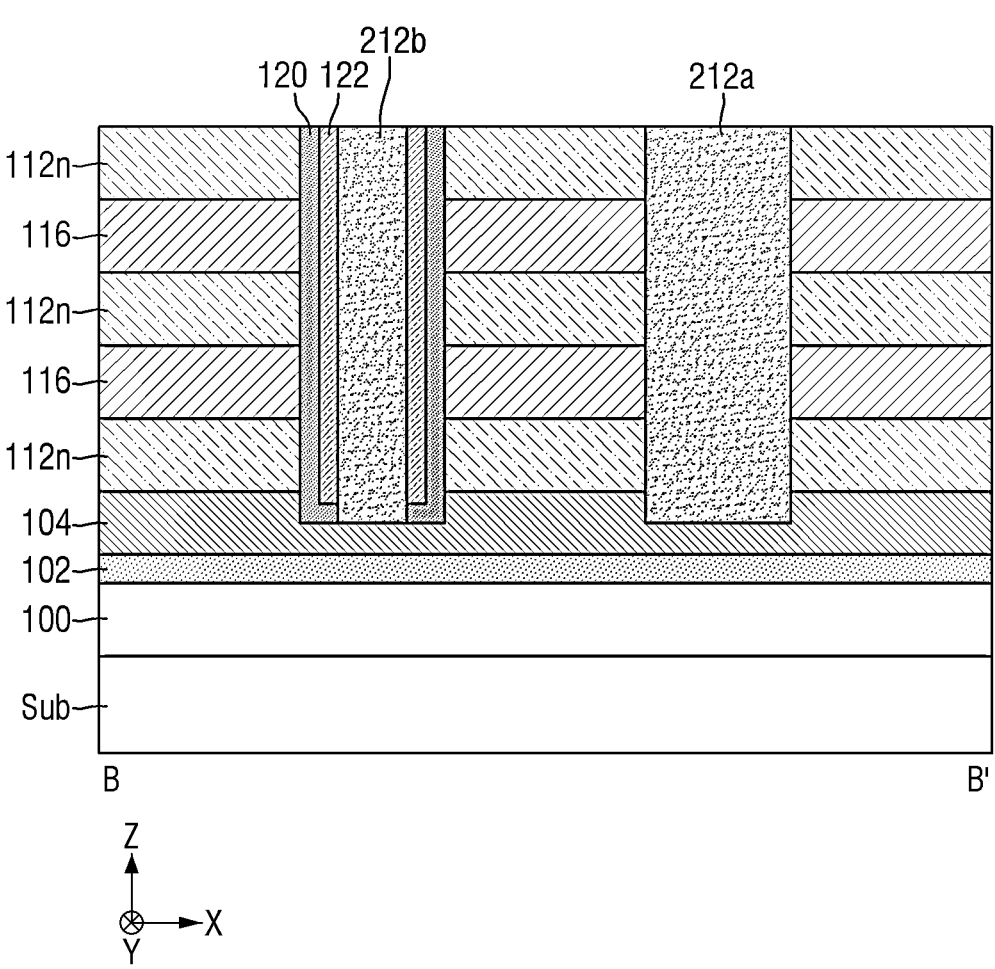
Figure 32:
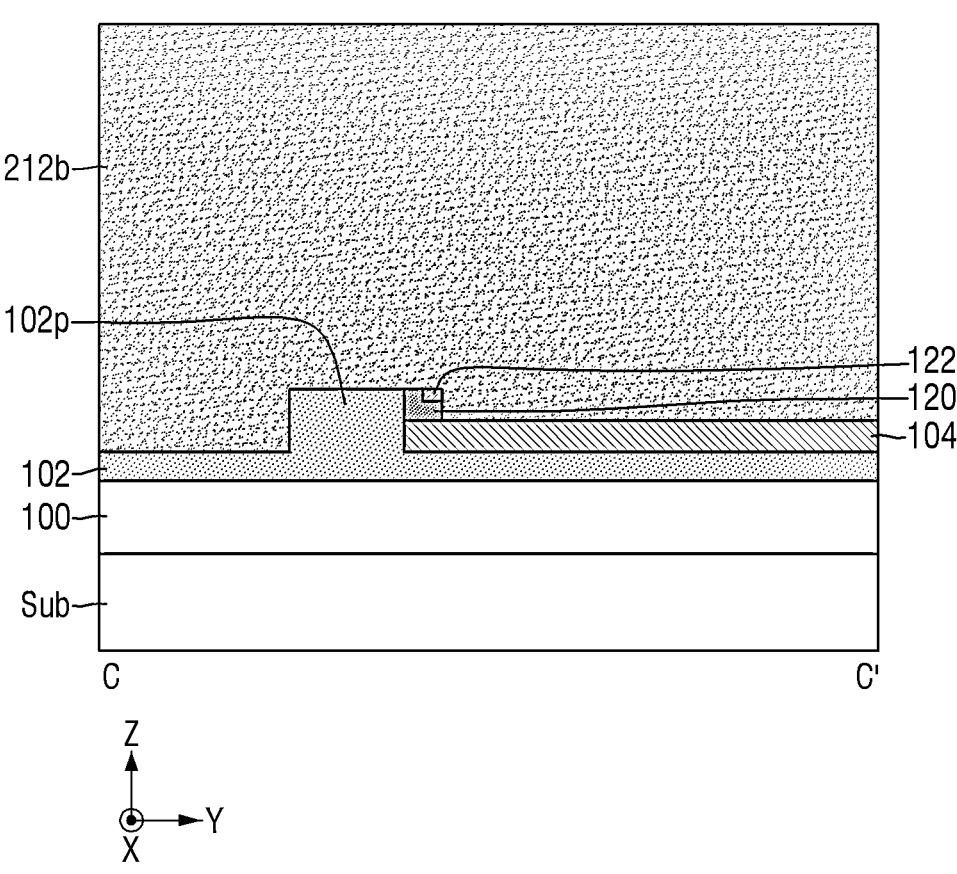

Referring to FIGS. 30 to 32, another insulating pattern 212b may be formed by filling the inside of the channel cut CH_CUT with an insulating material. In an implementation, the insulating material for forming the insulating pattern 212b may include, e.g., silicon oxide.

In an implementation, the insulating material for forming the insulating pattern 212b may extend in the third direction Z on the common source line conductive layer 104, and be filled along the ferroelectric layer 120 and the channel layer 122. In an implementation, the insulating material for forming the insulating pattern 212b may be formed on the bit line isolation layer 102, the bit line isolation layer protrusion 102p, the ferroelectric layer 120, the channel layer 122, and the common source line conductive layer 104.

Figure 33:
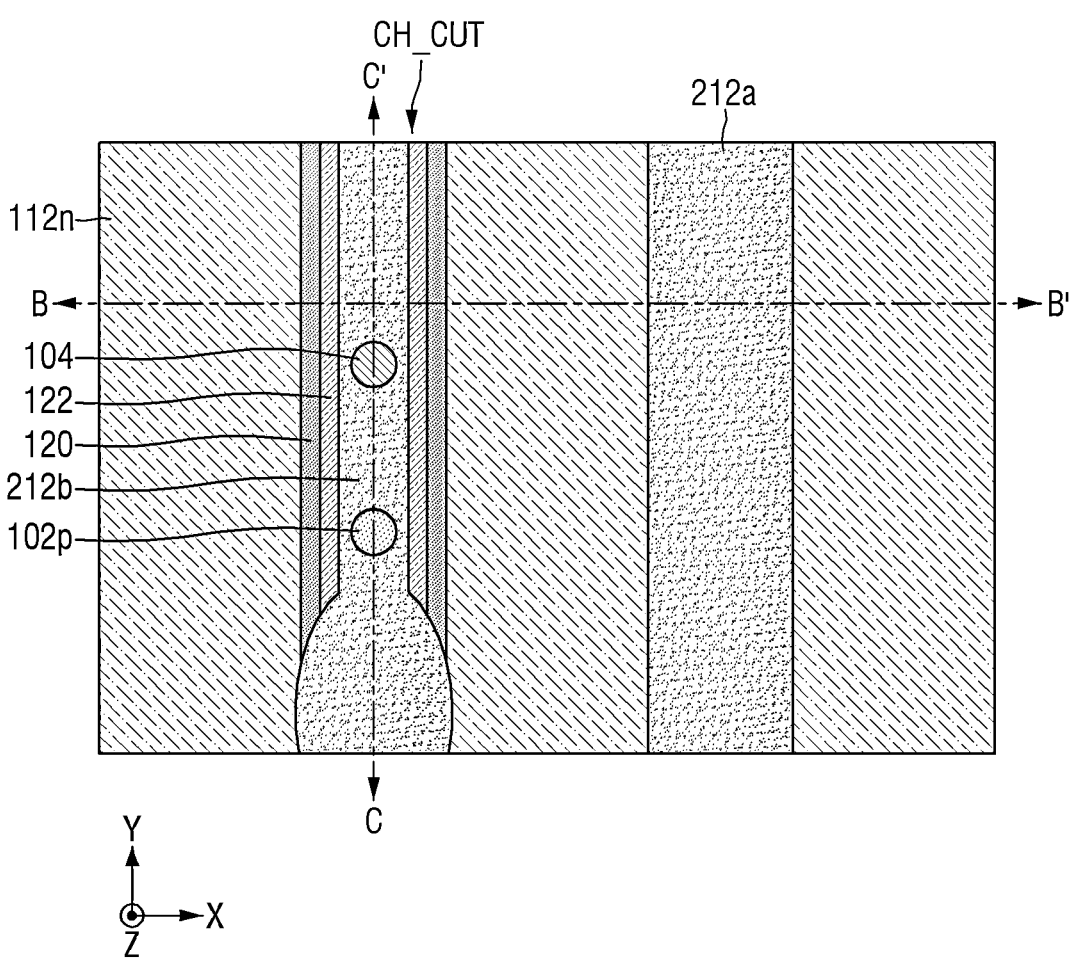
Figure 34:
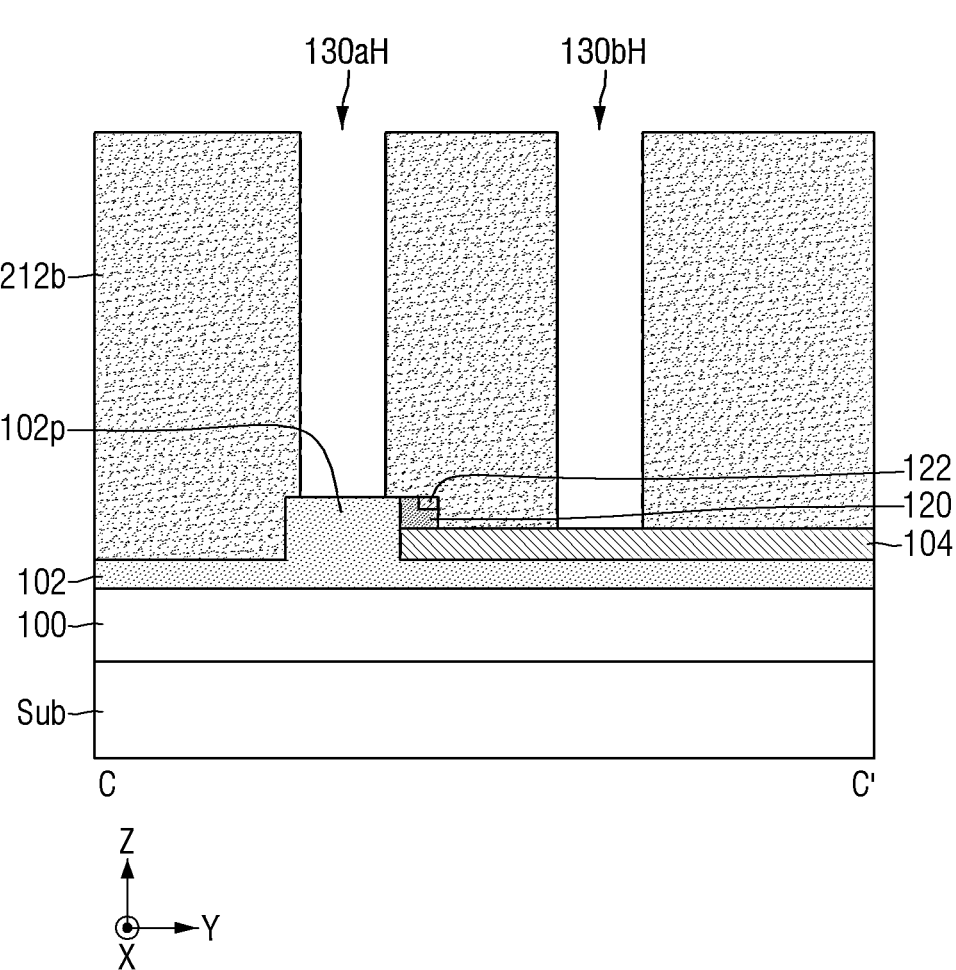

Referring to FIGS. 33 and 34, the inside of the insulating pattern 212b may be etched to form a first conductive filler hole 130aH in which a first conductive filler 130a is to be formed, and a second conductive filler hole 130bH in which a second conductive filler 130b is to be formed.

In an implementation, etching may be performed so that the first conductive filler hole 130aH is formed to extend in the third direction Z on the bit line isolation layer 102, e.g., on the bit line isolation layer protrusion 102p. In an implementation, etching may be performed so that the second conductive filler hole 130bH is formed on the common source line conductive layer 104 to extend in the third direction Z.

Figure 35:
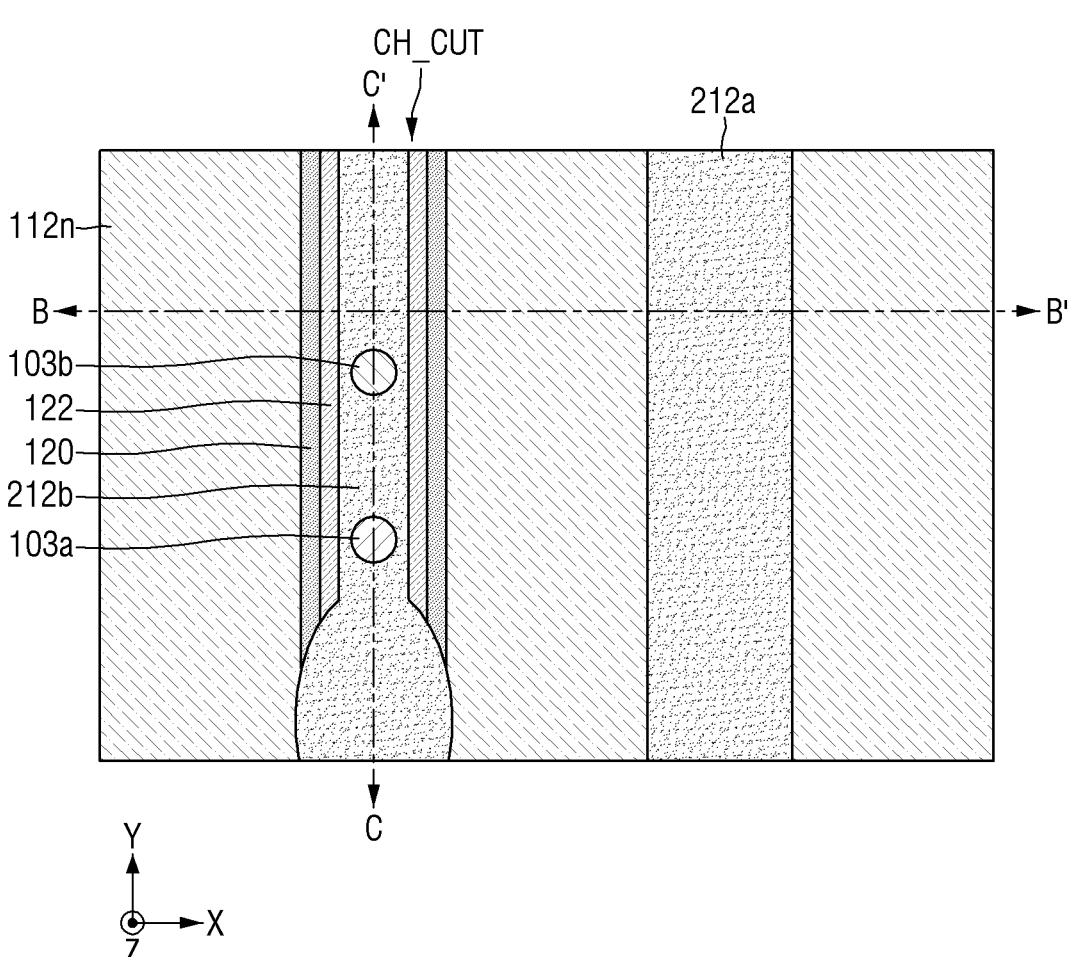
Figure 36:
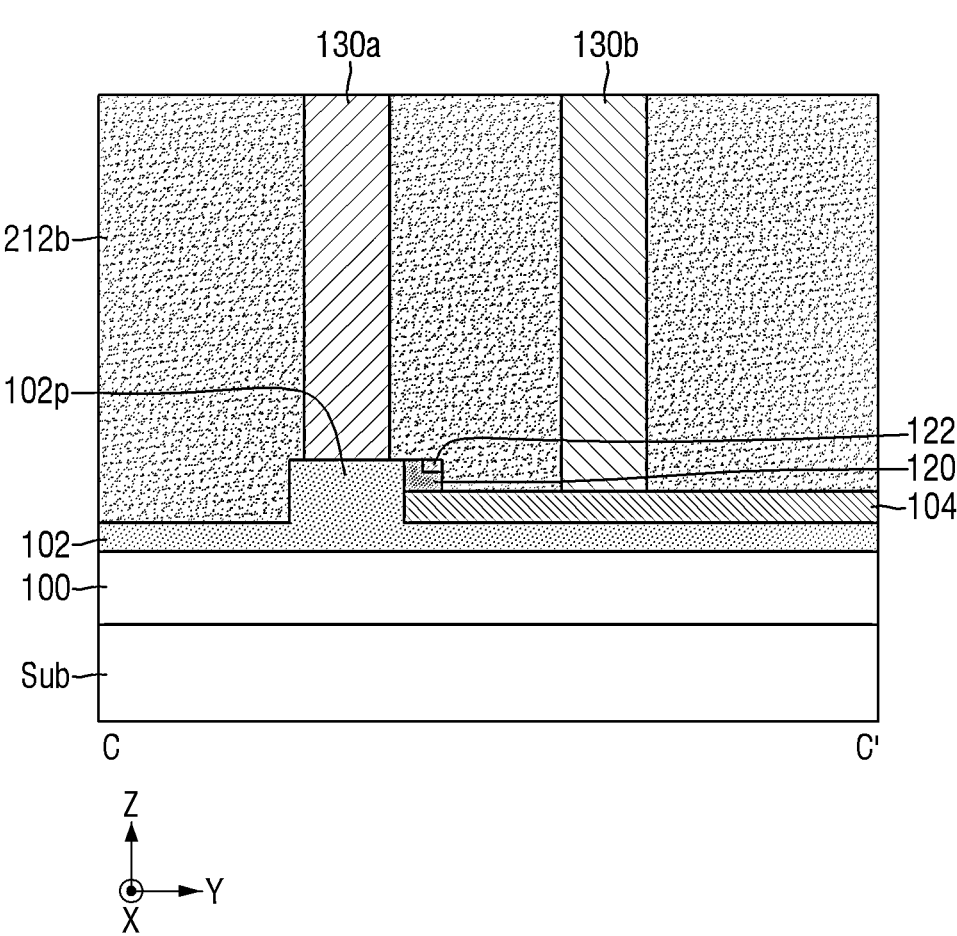

Referring to FIGS. 35 and 36, the inside of the first conductive filler hole 130aH may be filled with a conductive material to form the first conductive filler 130a. In an implementation, the inside of the second conductive filler hole 130bH may be filled with a conductive material to form the second conductive filler 130b.

In an implementation, the conductive material for filling the first conductive filler hole 130aH and the second conductive filler hole 130bH may include, e.g., doped semiconductor materials (e.g., doped silicon, doped germanium, or the like), conductive metal nitrides (e.g., titanium nitride, tantalum nitride, or the like), metals (e.g., tungsten, titanium, tantalum, or the like), metal-semiconductor compounds (e.g., tungsten silicide, cobalt silicide, titanium silicide, or the like), or combinations thereof.

Figure 37:
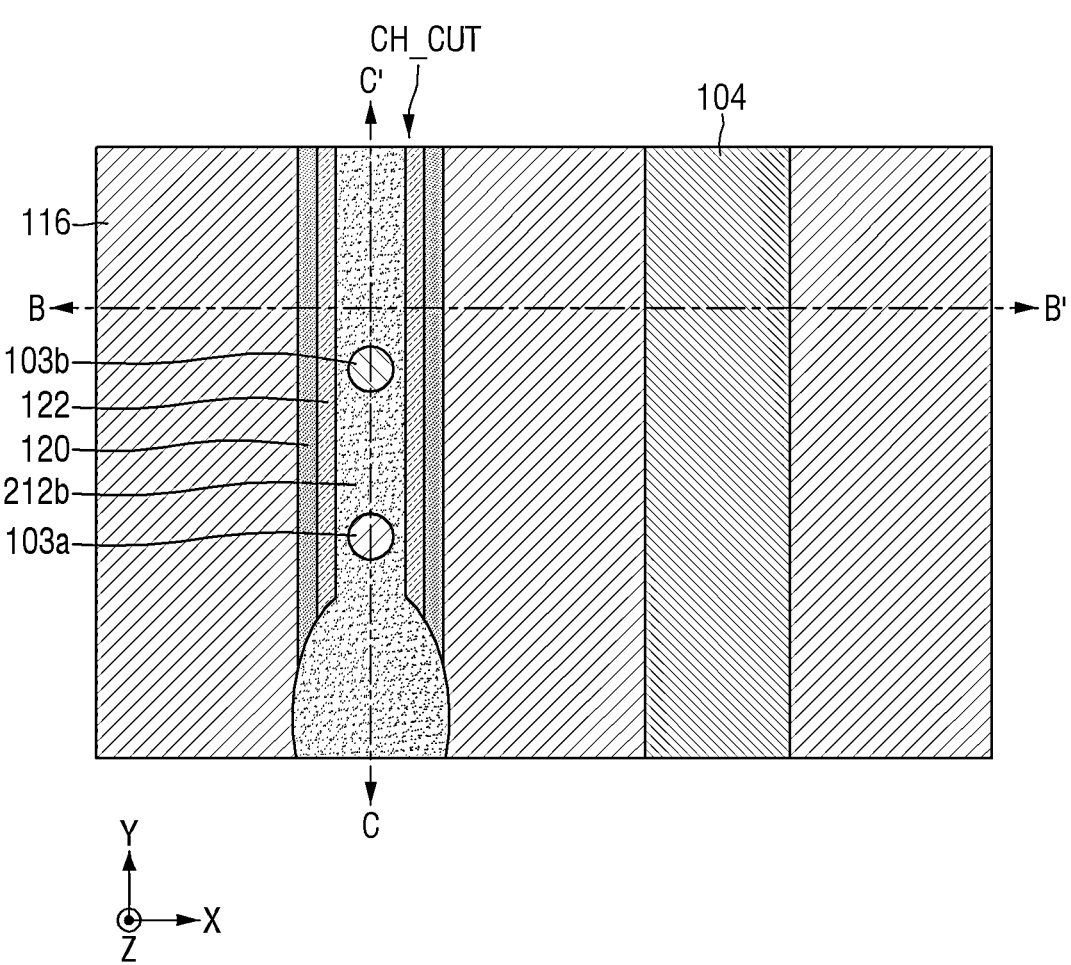
Figure 38:
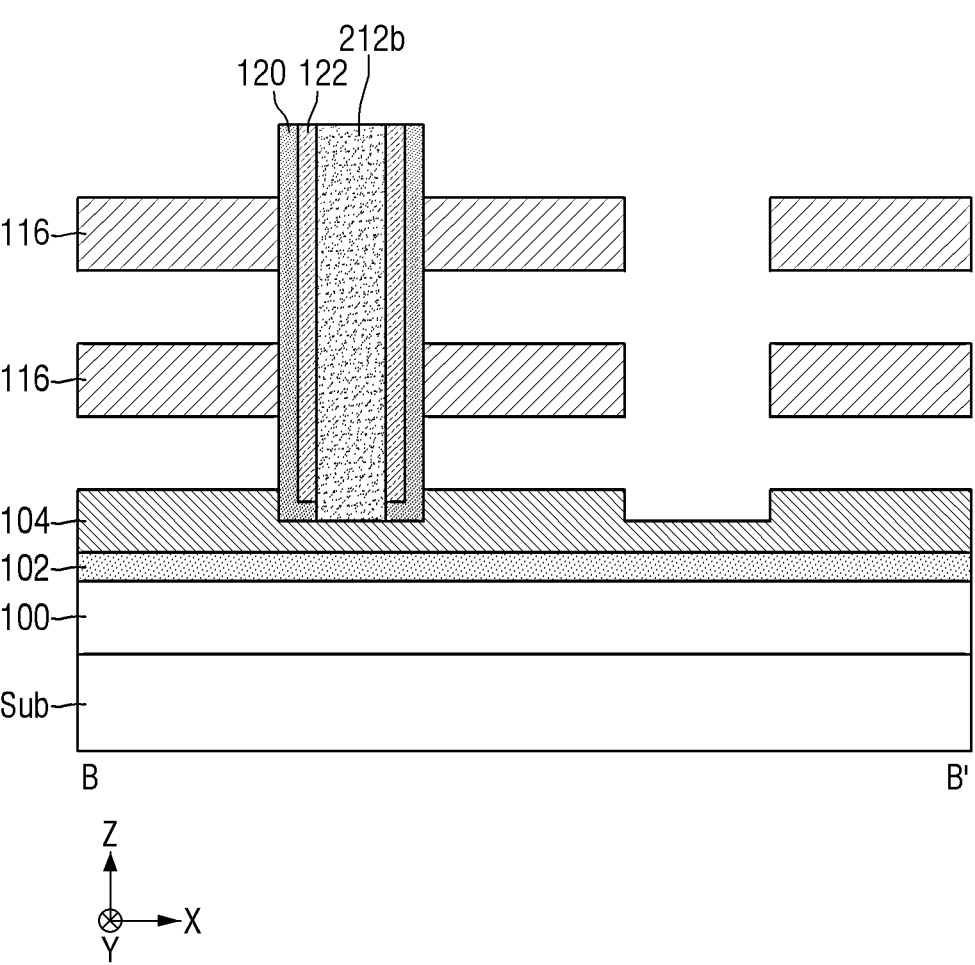

Referring to FIGS. 37 and 38, after removing the insulating pattern 212a, an etch-back process on the sacrificial layer 112n may be performed. In an implementation, the sacrificial layer 112n may be removed through the etch-back process on the sacrificial layer 112n to form a recess in the region in which the sacrificial layer 112n is formed.

After that, the recess region formed through the etch-back may be filled with the insulating material to form the insulating pattern 112, and a form which is alternately stacked with the conductive line 116 in the third direction Z may be formed as in FIG. 4 or 5.

Figure 39:
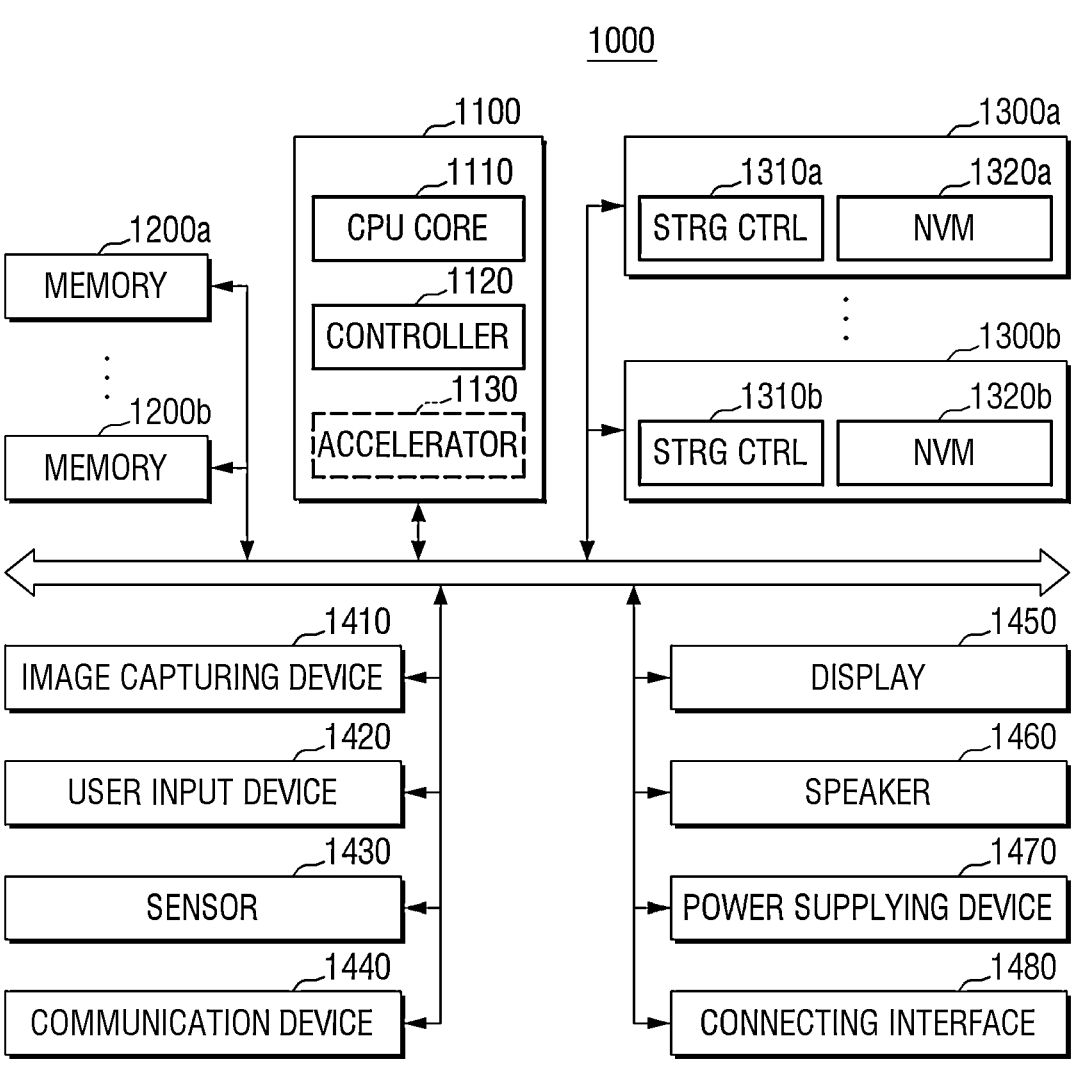
FIG. 39 is an exemplary block diagram of a non-volatile memory system including the non-volatile memory device according to some embodiments.

FIG. 39 is an exemplary block diagram of a non-volatile memory system including the non-volatile memory device according to some embodiments.

FIG. 39 is a diagram showing a non-volatile memory system 1000 to which a non-volatile memory device (e.g., the non-volatile memory device 1 of FIG. 4 or the non-volatile memory device 2 of FIG. 5) according to an embodiment may be applied. The non-volatile memory system 1000 of FIG. 39 may be, e.g., a mobile system, such as a mobile phone, a smart phone, a tablet PC (tablet personal computer), a wearable device, a healthcare device or an IOT (internet of things) device. In an implementation, the non-volatile memory system 1000 of FIG. 39 may be a personal computer, a laptop computer, a server, a media player, or an automotive device such as a navigation.

Referring to FIG. 39, the non-volatile memory system 1000 may include, e.g., a main processor 1100, memories 1200a and 1200b, and storage devices 1300a, 1300b, and may additionally include, e.g., an image capturing device 1410, a user input device 1420, a sensor 1430, a communication device 1440, a display 1450, a speaker 1460, a power supplying device 1470, and a connecting interface 1480.

The main processor 1100 may control the overall operations of the non-volatile memory system 1000, e.g., the operations of other components that make up the non-volatile memory system 1000. Such a main processor 1100 may be implemented as a general purpose processor, a dedicated processor, an application processor, or the like.

The main processor 1100 may include one or more CPU cores 1110, and may further include a controller 1120 for controlling the memories 1200a and 1200b or the storage devices 1300a and 1300b. In an implementation, the main processor 1100 may further include an accelerator 1130, which is a dedicated circuit for a high-speed data computation such as an AI (artificial intelligence) data computation. Such an accelerator 1130 may include a GPU (Graphics Processing Unit), an NPU (Neural Processing Unit) and/or a DPU (Data Processing Unit), or the like, and may be implemented as separate chips that are physically independent of other components of the main processor 1100.

The memories 1200a and 1200b may be used as a main memory unit of the non-volatile memory system 1000, and may include a volatile memory such as an SRAM and/or a DRAM, or may include a non-volatile memory such as a flash memory, a PRAM and/or a RRAM. The memories 1200a and 1200b may also be implemented in the same package as the main processor 1100.

The storage devices 1300a and 1300b may function as nonvolatile storage devices for storing data regardless of whether a power is supplied, and may have a relatively larger capacity than the memories 1200a and 1200b. The storage devices 1300a and 1300b may include storage controllers 1310a and 1310b, and non-volatile memories (NVM) 1320a and 1320b that store data under the control of the storage controllers 1310a and 1310b.

The non-volatile memories 1320a and 1320b may include a flash memory of a 2D (2-dimensional) structure or a 3D (3-dimensional) V-NAND (Vertical NAND) structure, but may also include other types of non-volatile memory such as a PRAM and/or a RRAM.

In an implementation, at least some of the non-volatile memories 1320a and 1320b may include the non-volatile memory device according to some embodiments described above using FIGS. 1 to 38.

The storage devices 1300a and 1300b may be included in the non-volatile memory system 1000 in a state of being physically separated from the main processor 1100, and may be implemented in the same package as the main processor 1100. In an implementation, the storage devices 1300a and 1300b may have a shape such as an SSD (solid state device) or a memory card, and the storage devices 1300a and 1300b may also be detachably coupled with other constituent elements of the non-volatile memory system 1000 through an interface such as a connecting interface 1480 to be described below. Such storage devices 1300a and 1300b may be, e.g., devices to which standard protocols such as a UFS (universal flash storage), an eMMC (embedded multimedia card), or an NVMe (non-volatile memory express) are applied.

The image capturing device 1410 may capture still images or moving images, and may be a camera, a camcorder, a webcam, or the like.

The user input device 1420 may receive various types of data that are input from users of the non-volatile memory system 1000, and may include a touch pad, a key pad, a key board, a mouse, or a microphone.

The sensor 1430 may detect various types of physical quantities that may be acquired from the outside of the non-volatile memory system 1000, and convert the detected physical quantities into electrical signals. Such a sensor 1430 may include a temperature sensor, a pressure sensor, an illuminance sensor, a position sensor, an acceleration sensor, a biosensor, or a gyroscope sensor.

The communication device 1440 may transmit and receive signals to and from other devices outside the non-volatile memory system 1000 according to various communication protocols. Such a communication device 1440 may be implemented to include an antenna, a transceiver, a modem, or the like.

The display 1450 and the speaker 1460 may each function as output devices that output visual and auditory information to the user of the non-volatile memory system 1000.

The power supplying device 1470 may appropriately convert the power supplied from a battery equipped in the non-volatile memory system 1000 or an external power source, and supply the power to each constituent element of the non-volatile memory system 1000.

The connecting interface 1480 may provide a connection between the non-volatile memory system 1000 and an external device that may be connected to the non-volatile memory system 1000 to transmit and receive data to and from the non-volatile memory system 1000. The connecting interface 1480 may be implemented by various interface types, e.g., an ATA (Advanced Technology Attachment), a SATA (Serial ATA), an e-SATA (external SATA), a SCSI (Small Computer Small Interface), a SAS (Serial Attached SCSI), a PCI (Peripheral Component Interconnection), a PCIe (PCI express), a NVMe, an IEEE 1394, a USB (universal serial bus), an SD (secure digital) card, a MMC (multi-media card), an eMMC, a UFS, an eUFS (embedded Universal Flash Storage), or a CF (compact flash) card interface.

One or more embodiments may provide a non-volatile memory device including a ferroelectric field effect transistor (FeFET) and a system including the same.

One or more embodiments may provide a non-volatile memory device in which complexity of a metal line formation procedure in a BEOL (Back End Of Line) process is reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A non-volatile memory device, comprising:
a substrate;
an insulating layer on the substrate;
a bit line isolation layer on the insulating layer;
a common source line conductive layer on the bit line isolation layer;
a ferroelectric memory cell on the bit line isolation layer;
a bit line connected to a top of the ferroelectric memory cell; and
a common source line connected to the common source line conductive layer and electrically connected to the ferroelectric memory cell,
wherein:
the ferroelectric memory cell includes a ferroelectric layer, a channel layer, a first conductive filler connected to the ferroelectric layer and the channel layer and extending in a vertical direction, and a second conductive filler connected to the ferroelectric layer and the channel layer and extending in the vertical direction,
the first conductive filler is connected to the bit line, and
the second conductive filler is connected to the common source line.

2. The non-volatile memory device as claimed in claim 1, wherein:
the bit line extends in a first direction that intersects the vertical direction, and
the common source line extends in the first direction.

3. The non-volatile memory device as claimed in claim 1, wherein:
the bit line extends in a first direction that intersects the vertical direction, and
the common source line extends in a second direction that intersects the first direction.

4. The non-volatile memory device as claimed in claim 1, wherein the bit line isolation layer includes an insulating material.

5. The non-volatile memory device as claimed in claim 1, wherein:
the common source line conductive layer includes an opening therein,
the bit line isolation layer includes a bit line isolation layer protrusion that protrudes through the opening in the common source line conductive layer, and
the bit line isolation layer protrusion is connected to the first conductive filler.

6. The non-volatile memory device as claimed in claim 1, further comprising a conductive line that is electrically connected to the ferroelectric layer and directly adjacent thereto in a first direction that intersects the vertical direction.

7. The non-volatile memory device as claimed in claim 6, further comprising a word line that is electrically connected to the conductive line, and that extends in the first direction.

8. A non-volatile memory device, comprising:
a substrate;
an insulating layer on the substrate;
a bit line isolation layer on the insulating layer;
a common source line conductive layer on the bit line isolation layer; and
a ferroelectric memory cell on the bit line isolation layer,
wherein:
the ferroelectric memory cell includes a ferroelectric layer, a channel layer, a first conductive filler connected to the ferroelectric layer and the channel layer and extending in a vertical direction, and a second conductive filler connected to the ferroelectric layer and the channel layer and extending in the vertical direction, the first conductive filler is connected to the bit line isolation layer, and the second conductive filler is connected to the common source line conductive layer.

9. The non-volatile memory device as claimed in claim 8, wherein the bit line isolation layer includes a bit line isolation layer protrusion that penetrates the common source line conductive layer in the vertical direction.

10. The non-volatile memory device as claimed in claim 9, wherein a height of the bit line isolation layer protrusion in the vertical direction is the same as a height of the common source line conductive layer in the vertical direction.

11. The non-volatile memory device as claimed in claim 9, wherein a height of the bit line isolation layer protrusion in the vertical direction is different from a height of the common source line conductive layer in the vertical direction.

12. The non-volatile memory device as claimed in claim 9, wherein the common source line conductive layer includes a common source line conductive layer protrusion that protrudes in the vertical direction along a side wall of the bit line isolation layer protrusion.

13. The non-volatile memory device as claimed in claim 8, further comprising:

a first insulating layer on the common source line conductive layer and surrounding the first conductive filler and the second conductive filler; and a second insulating layer surrounding the first insulating layer, penetrating through at least a part of the common source line conductive layer, and on the bit line isolation layer.

14. A non-volatile memory system, comprising:

a main processor;

a storage device that transmits and receives data for operation of the main processor; and a non-volatile memory device that stores data, wherein the non-volatile memory device includes:

a substrate;

an insulating layer on the substrate;

a bit line isolation layer on the insulating layer;

a common source line conductive layer on the bit line isolation layer;

a ferroelectric memory cell on the bit line isolation layer;

a bit line connected to a top of the ferroelectric memory cell; and a common source line connected to the common source line conductive layer and electrically connected to the ferroelectric memory cell, wherein the ferroelectric memory cell includes a ferroelectric layer, a channel layer, a first conductive filler connected to the ferroelectric layer and the channel layer and extending in a vertical direction, and a second conductive filler connected to the ferroelectric layer and the channel layer and extending in the vertical direction, wherein the first conductive filler is connected to the bit line, and wherein the second conductive filler is connected to the common source line.

15. The non-volatile memory system as claimed in claim 14, wherein:

the bit line extends in a first direction that intersects the vertical direction, and the common source line extends in the first direction.

16. The non-volatile memory system as claimed in claim 14, wherein:

the bit line extends in a first direction that intersects the vertical direction, and the common source line extends in a second direction that intersects the first direction.

17. The non-volatile memory system as claimed in claim 14, wherein the bit line isolation layer includes an insulating material.

18. The non-volatile memory system as claimed in claim 14, wherein:

the common source line conductive layer includes an opening therein, the bit line isolation layer includes a bit line isolation layer protrusion that protrudes through the opening in the common source line conductive layer, and the bit line isolation layer protrusion is connected to the first conductive filler.

19. The non-volatile memory system as claimed in claim 14, further comprising a conductive line that is electrically connected to the ferroelectric layer and directly adjacent thereto in a first direction that intersects the vertical direction.

20. The non-volatile memory system as claimed in claim 19, further comprising a word line that is electrically connected to the conductive line, and that extends in the first direction.

* * * * *